US012648454B2

(12) United States Patent
Tamimoto et al.

(10) Patent No.: US 12,648,454 B2
(45) Date of Patent: Jun. 2, 2026

(54) SEMICONDUCTOR DEVICE

(71) Applicant: RENESAS ELECTRONICS CORPORATION, Tokyo (JP)

(72) Inventors: Hideaki Tamimoto, Tokyo (JP); Masatoshi Sugiura, Tokyo (JP); Atsushi Sakazaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 422 days.

(21) Appl. No.: 18/483,740

(22) Filed: Oct. 10, 2023

(65) Prior Publication Data

US 2024/0170373 A1     May 23, 2024

(30) Foreign Application Priority Data

Nov. 22, 2022     (JP) ................................. 2022-186446

(51) Int. Cl.
H01L 23/495 (2006.01)
H01L 21/48 (2006.01)
(Continued)

(52) U.S. Cl.
CPC .... *H01L 23/49513* (2013.01); *H01L 21/4828* (2013.01); *H01L 21/4842* (2013.01); *H01L 23/49548* (2013.01); *H01L 23/49582* (2013.01); *H01L 24/05* (2013.01); *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 23/295* (2013.01); *H01L 23/3121* (2013.01); *H01L 23/49562* (2013.01); *H01L 23/49568* (2013.01); *H01L 24/83* (2013.01); *H01L 24/85* (2013.01); *H01L 24/92* (2013.01); *H01L 2224/05553* (2013.01); *H01L*

*2224/05554* (2013.01); *H01L 2224/0603* (2013.01); *H01L 2224/06051* (2013.01); *H01L 2224/2929* (2013.01); *H01L 2224/29339* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01);
(Continued)

(58) Field of Classification Search
None
See application file for complete search history.

(56) References Cited

U.S. PATENT DOCUMENTS 9,806,007 B2     10/2017   Kamachi et al.

FOREIGN PATENT DOCUMENTS

JP          2004-335776  A      11/2004
JP          2017-135336  A      8/2017

*Primary Examiner* — Anthony Ho
(74) *Attorney, Agent, or Firm* — Rimon P.C.

(57) ABSTRACT

An upper surface of a main portion of a die pad includes a first region overlapping a semiconductor chip, a second region arranged between a side and the first region, and a third region arranged between the first region and a connecting portion. In the upper surface of the main portion, each of a second trench length of a second trench arranged in the second region and a third trench length of a third trench arranged in the third region is larger than a first trench length of a first trench arranged in the connecting portion. Each of a second trench width of the second trench arranged in the second region and a third trench width of the third trench arranged in the third region is smaller than a first trench width of the first trench arranged in the connecting portion.

19 Claims, 21 Drawing Sheets

(51) Int. Cl.
  *H01L 23/00*     (2006.01)
  *H01L 23/29*     (2006.01)
  *H01L 23/31*     (2006.01)

(52) U.S. Cl.
  CPC ............... *H01L 2224/48108* (2013.01); *H01L
      2224/48247* (2013.01); *H01L 2224/49111*
    (2013.01); *H01L 2224/73265* (2013.01); *H01L
      2224/83447* (2013.01); *H01L 2224/83815*
    (2013.01); *H01L 2224/83862* (2013.01); *H01L
      2224/85439* (2013.01); *H01L 2224/92247*
      (2013.01); *H01L 2924/13091* (2013.01)

LFf

LFd

LFd

LFt1

30(30t)

20s1

20(20t)

20s2

LFt2

30(30t)

20(20t)

LFt2

20s2

20(20t)

20(20t)

30(30t)

20s1

30(30t)

LFt1

LFd

LFd

LFf

SEMICONDUCTOR DEVICE

CROSS-REFERENCE TO RELATED APPLICATION

The disclosure of Japanese Patent Application No. 2022-186446 filed on Nov. 22, 2022, including the specification, drawings and abstract is incorporated herein by reference in its entirety.

BACKGROUND

The present invention relates to a semiconductor device. There are disclosed techniques listed below.
[Patent Document 1] Japanese Unexamined Patent Application Publication No. 2004-335776
[Patent Document 2] Japanese Unexamined Patent Application Publication No. 2017-135336
In some cases, a trench is formed in a die pad in a semiconductor device in which a semiconductor chip that is mounted on the die pad is sealed with a sealing body. For example, the Patent Document 1 (Japanese Unexamined Patent Application Publication No. 2004-335776) describes a semiconductor device in which a resin lock trench and a solder trench are arranged in a frame on which a semiconductor pellet is mounted. The Patent Document 2 (Japanese Unexamined Patent Application Publication No. 2017-135336) describes a semiconductor device in which a plurality of trenches is arranged in a die pad on which a semiconductor chip is mounted.

SUMMARY

In a semiconductor device in which a semiconductor chip that is mounted on a die pad is electrically connected with a plurality of leads via a plurality of wires, the semiconductor chip and the wires are sealed with a sealing body for protection of the semiconductor chip and the wires. The sealing body seals part of the die pad and part of each of the leads in addition to the semiconductor chip and the wires. Peeling of a contact surface between the sealing body and the die pad or a contact surface between the sealing body and a lead may cause a deterioration in performance of the semiconductor device.

Other problems and novel characteristics will be apparent from the description of the present specification and the drawings.

A semiconductor device according to one embodiment includes: a die pad having a first surface; a semiconductor chip mounted on a first region of the first surface of the die pad via a die bonding material; a plurality of leads arranged along a first chip side, which is extending in a first direction, of a plurality of sides of the semiconductor chip; a plurality of wires electrically connecting a plurality of electrode pads arranged on a first chip surface of the semiconductor chip with the plurality of leads, respectively; and a sealing body sealing the semiconductor chip and the plurality of wires so as to contact with the first surface of the die pad. The die pad includes: a first portion having a first side facing the plurality of leads in plan view, and including the first region; a second portion having a second side opposite the first side in plan view; and a third portion connecting the first portion and the second portion with each other. A width of the third portion that is a length of the third portion in the first direction is smaller than a width of the first portion that is a length of the first portion in the first direction. The first surface of the die pad includes the first region overlapping the semiconductor chip, a second region arranged between the first side and the first region, and a third region arranged between the first region and the third portion. In the first surface of the die pad, a first trench arranged in the third portion, and extending in the first direction, a second trench arranged in the second region of the first portion, and extending in the first direction, and a third trench arranged in the third region of the first portion, and extending in the first direction are formed. The first trench has a first trench length that is a length of the first trench in the first direction and a first trench width that is a length of the first trench in a second direction crossing the first direction. The second trench has a second trench length that is a length of the second trench in the first direction and a second trench width that is a length of the second trench in the second direction. The third trench has a third trench length that is a length of the third trench in the first direction and a third trench width that is a length of the third trench in the second direction. Each of the second trench length and the third trench length is larger than the first trench length. Each of the second trench width and the third trench width is smaller than the first trench width.

A semiconductor device according to another embodiment of the present invention includes: a die pad having a first surface; a semiconductor chip mounted on the first surface of the die pad via a die bonding material; a plurality of leads arranged in a first direction; a plurality of wires electrically connecting a plurality of electrode pads arranged on a first chip surface of the semiconductor chip with the plurality of leads, respectively; and a sealing body sealing the semiconductor chip and the plurality of wires. Each of the plurality of leads includes a first lead surface, a second lead surface opposite the first lead surface, an inner lead portion sealed with the sealing body, and an outer lead portion exposed from the sealing body. The plurality of leads includes a first lead electrically connected with a first electrode pad of the plurality of electrode pads via a first wire of the plurality of wires. The first lead surface of the first lead includes: a first wire bonding region covered with a first metal film to which the first wire is bonded; a first lead trench arranged between the outer lead portion and the first wire bonding region, and extending in the first direction; and a second lead trench arranged between the outer lead portion and the first lead trench, and having a second trench depth shallower than a first trench depth of the first lead trench. The second lead surface of the first lead includes a third lead trench arranged between the outer lead portion and a region opposite the first lead trench, and having a third trench depth shallower than the first trench depth of the first lead trench.

BRIEF DESCRIPTIONS OF THE DRAWINGS

FIG. 4 is a cross-sectional view taken along line A-A of FIG. 3.

FIG. 17 is an enlarged cross-sectional view taken along line H-H of FIG. 15.

FIG. 20 is an enlarged cross-sectional view taken along line K-K of FIG. 18.

Figure 1:
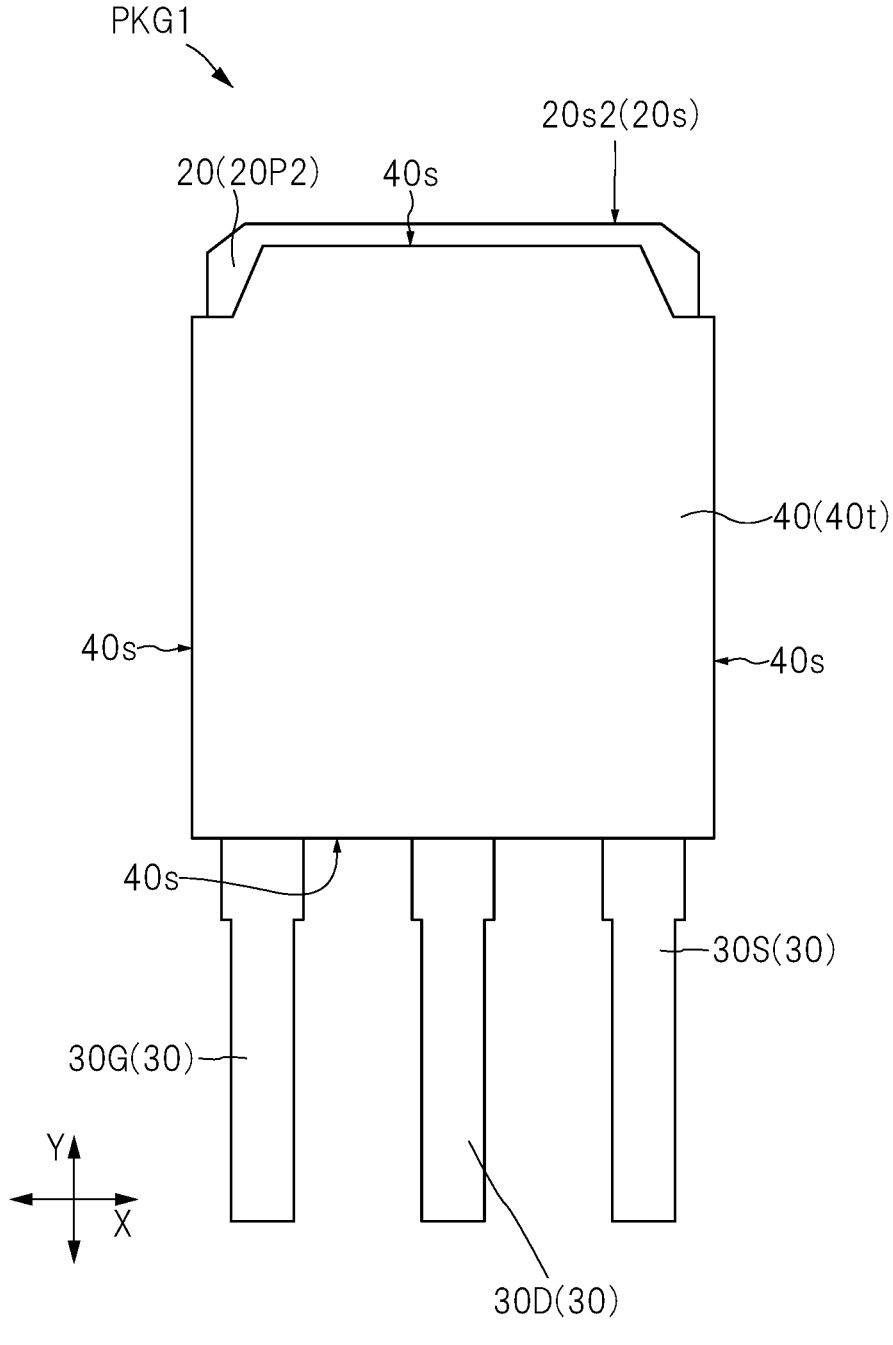
FIG. 1 is a top view of a semiconductor device according to one embodiment.

DETAILED DESCRIPTION (Explanation of Description Form, Basic Term and Usage in Present Application)

In the present application, the embodiments will be described in a plurality of sections when required as a matter of convenience. However, these sections are not irrelevant to each other unless otherwise stated. Regardless of before and after the description, one part of a simple example is a detailed part, a part, or the entire of a modification example of the other. Also, in principle, the repetitive description of the same part is omitted. Further, each element in the embodiment is not indispensable unless otherwise particularly stated not to be so, logically limited to the number, and clearly not to be so from the contexts.

Similarly, when a material, a composition or others is described as "X made of A" or others in the description of the embodiments or others, the one containing other components than A is not excluded unless otherwise stated not to be so and clearly not being so from the contexts. For example, the component means "X containing A as a main component" or others. For example, the component means "X containing A as a main component" or others. For example, it is needless to say that a "silicon material" and others includes not only pure silicon but also SiGe (silicon germanium) alloy or other multicomponent alloy containing silicon as a main component, or a material containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, the specific numerical value and the numerical amount may exceed the specific numerical values or smaller than the specific numerical values unless otherwise specified not to be so, logically limited to the number, and clearly not being so from the contents.

Still further, in each drawing of the embodiments, the same or similar parts are denoted by the same or similar symbol or reference number, and the description thereof is not repeated in principle.

Also, in the attached drawings, hatching or others is omitted even in a cross-sectional view in some cases such as a case of causing complication or a case of clearly distinguishing a portion from a space. In respect to this, a background outline is omitted even in a closed hole in a plan view when being clear from the explanation or others. Further, hatching or a dot pattern is added to a drawing in some cases in order to clearly show that the portion is not the space or clearly show a boundary between regions even if the drawing is not a cross-sectional view.

In the embodiments described below, as an example of the semiconductor device, a semiconductor device that is called a power device or a power semiconductor device embedded in a power controller circuit such as a power supply circuit will be exemplified and described. The semiconductor device described below functions as a switching element embedded in a power converter circuit.

<Semiconductor Device>

Figure 2:
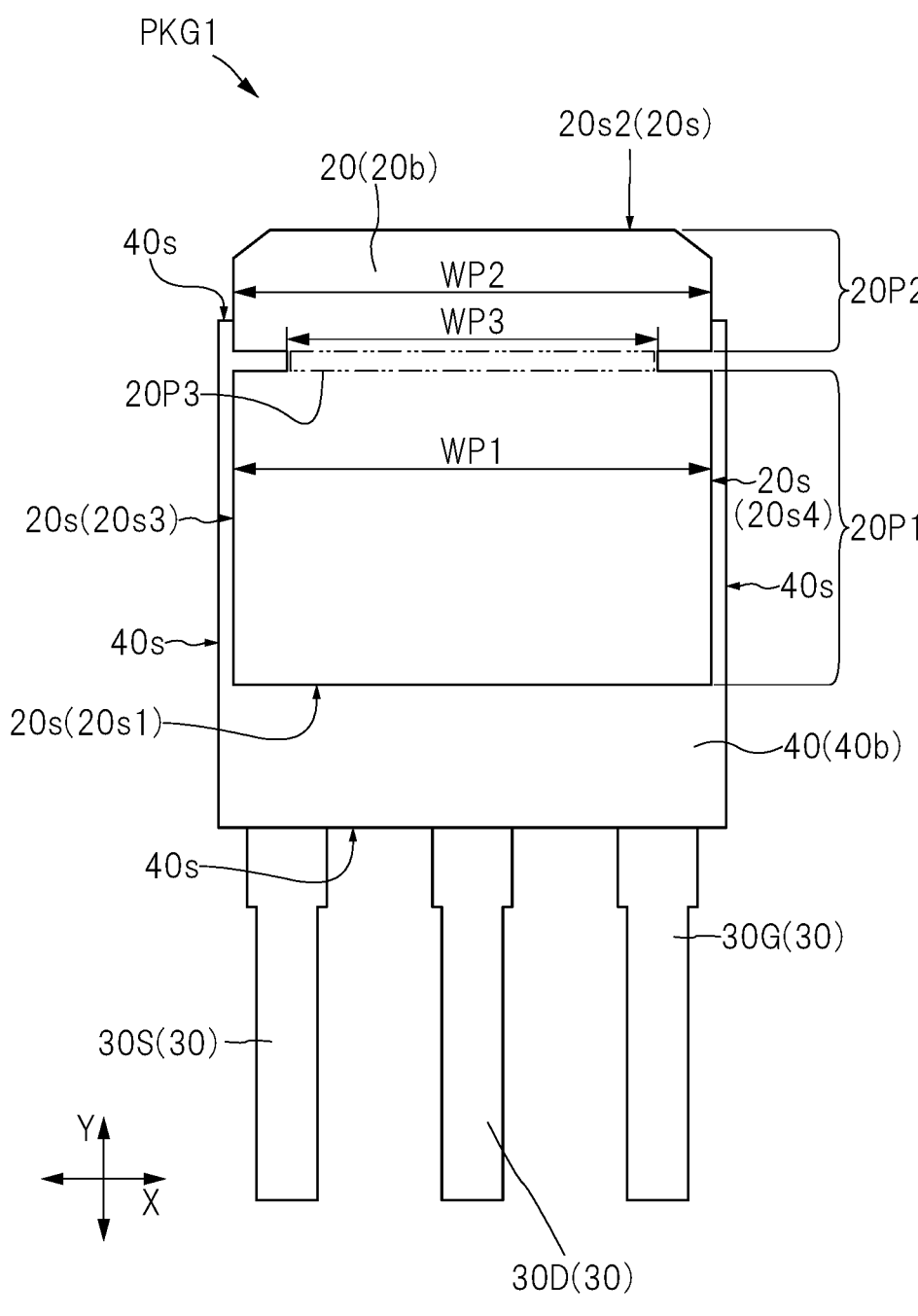
FIG. 2 is a bottom view of the semiconductor device of FIG. 1.
Figure 3:
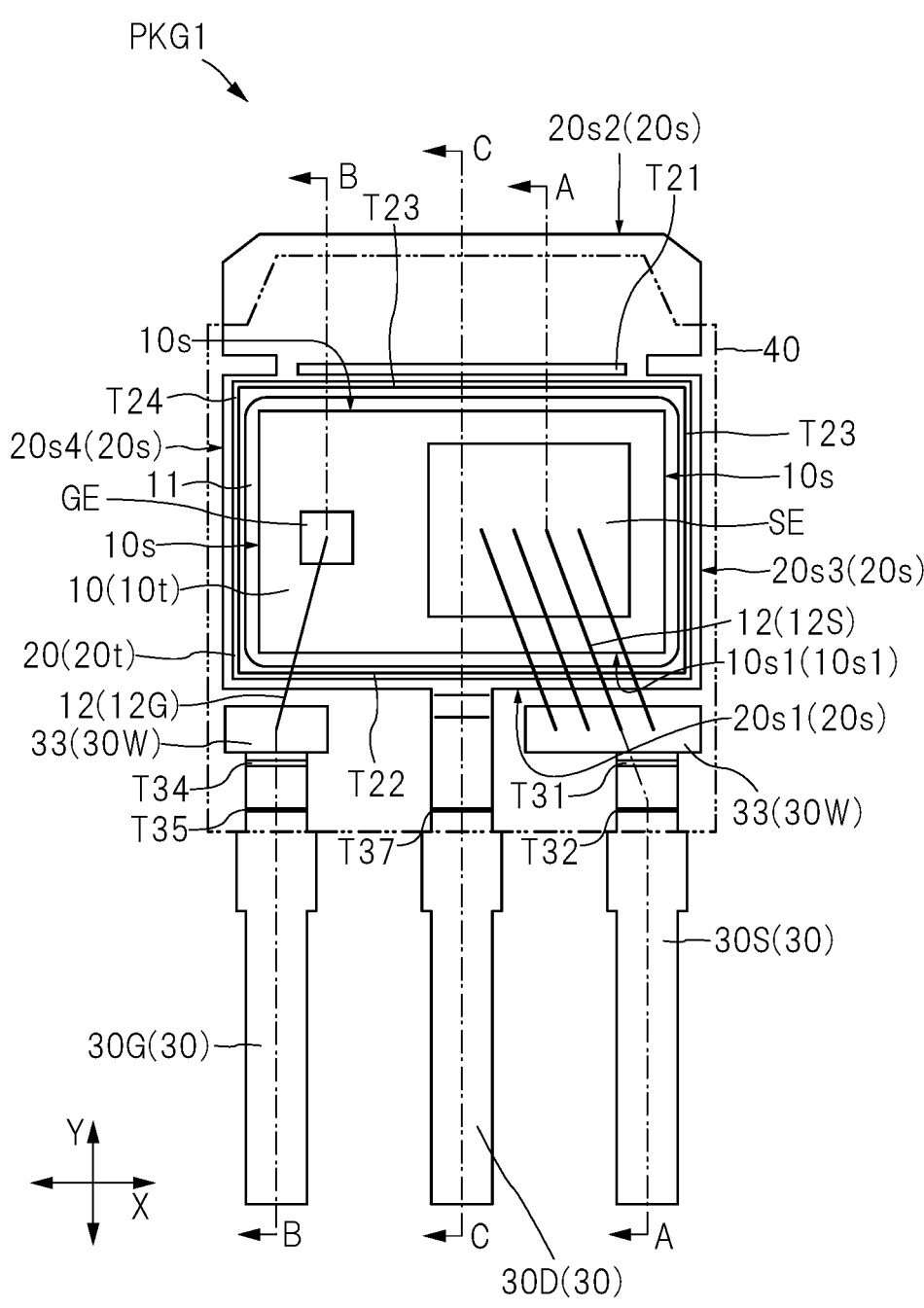
FIG. 3 is a transparent plan view of an inner structure of the semiconductor device without a sealing body of FIG. 1 is.
Figure 4:
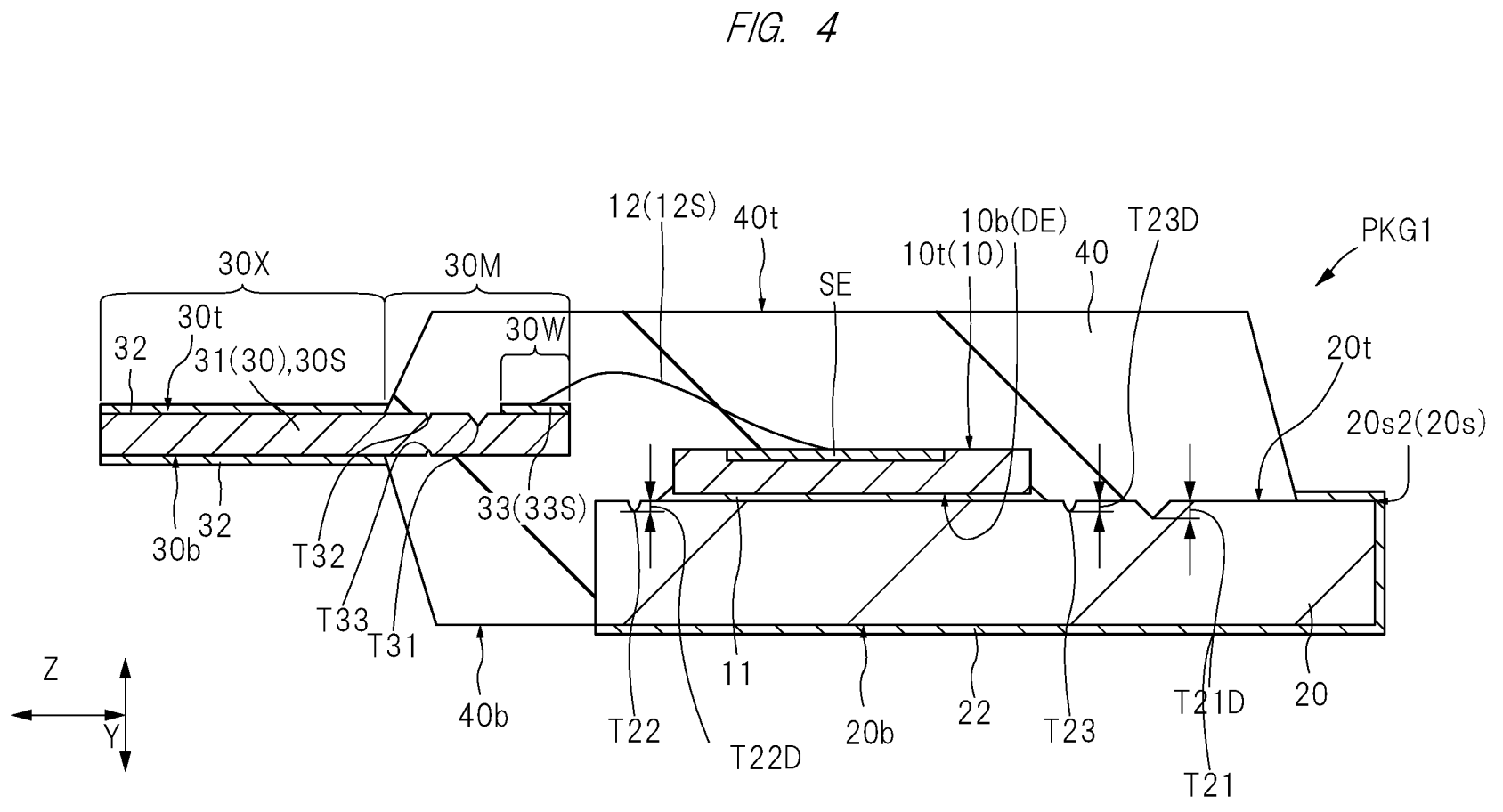
Figure 5:
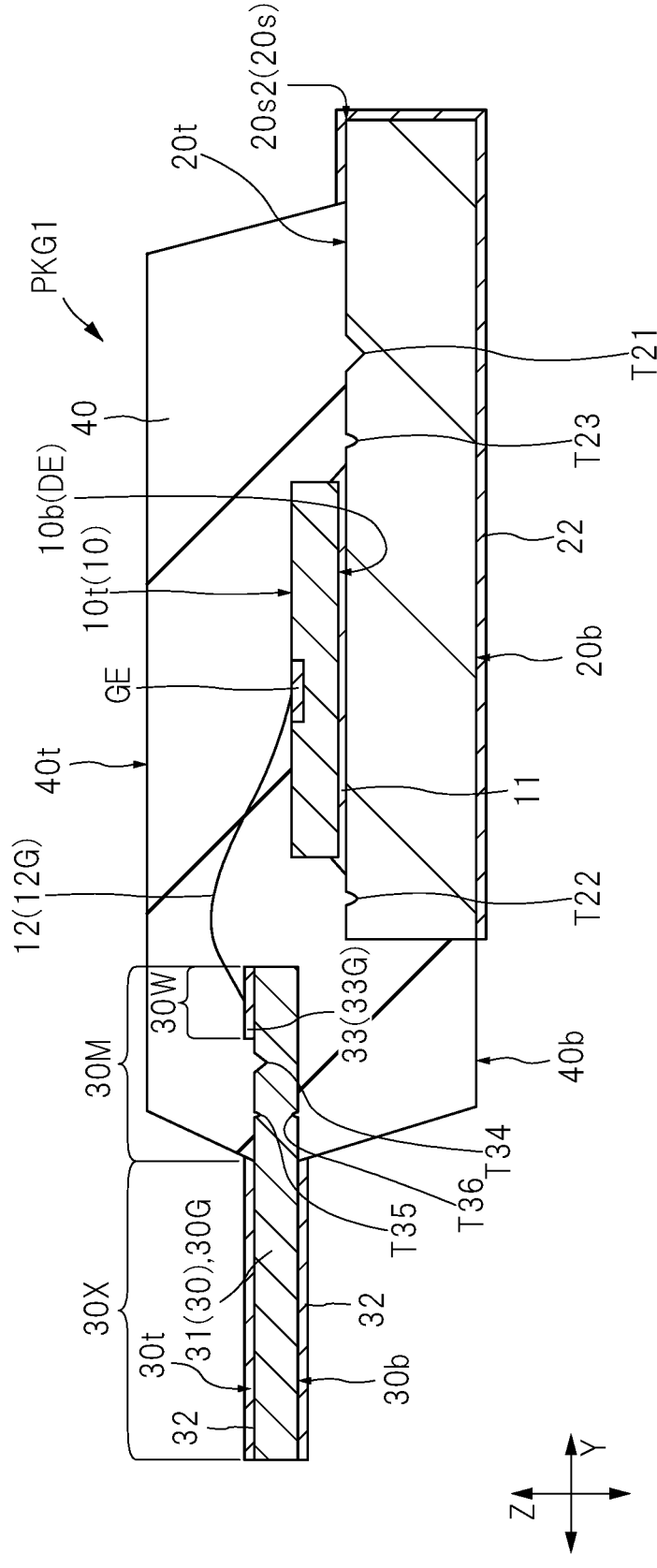
FIG. 5 is a cross-sectional view taken along line B-B of FIG. 3.
Figure 6:
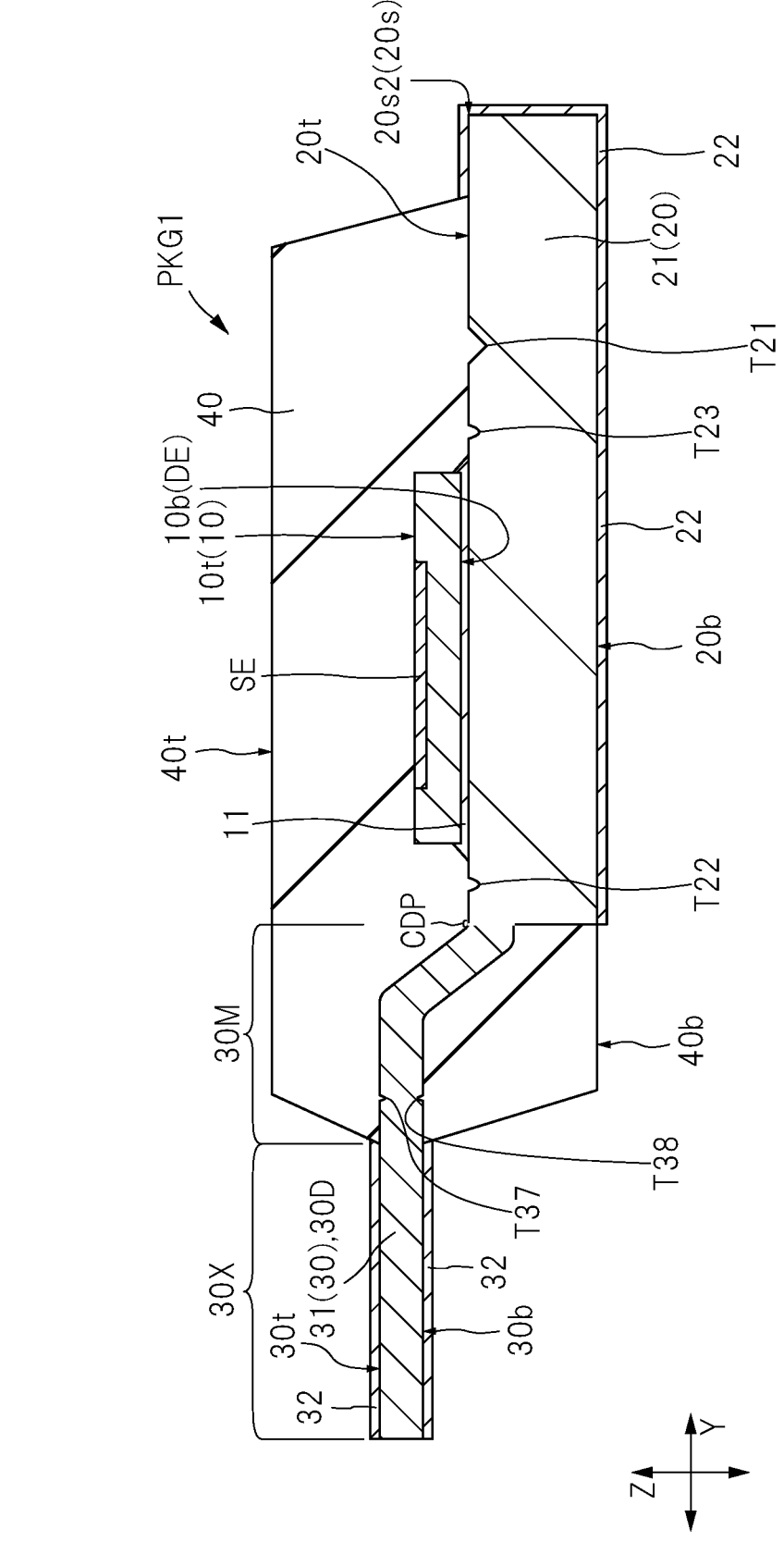
FIG. 6 is a cross-sectional view taken along line C-C of FIG. 3.

A package structure of a semiconductor device PKG1 of FIG. 1 will be first described. FIG. 1 is a top view of a semiconductor device according to an embodiment. FIG. 2 is a bottom view of the semiconductor device of FIG. 1. FIG. 3 is a transparent plan view of an inner structure of the semiconductor device without a sealing body of FIG. 1. FIG. 4 is a cross-sectional view taken along line A-A of FIG. 3, FIG. 5 is a cross-sectional view taken along line B-B of FIG. 3, and FIG. 6 is a cross-sectional view taken along line C-C of FIG. 3.

Any of X direction, Y direction, and Z direction (see FIGS. 4 to 6) is illustrated in FIGS. 1 to 6. The Y direction crosses the X direction, and the X direction and the Y direction are orthogonal to each other in the following description. The Z direction is orthogonal to the X direction and the Y direction. In other words, the Z direction is a normal line with respect to the X-Y plane including the X direction and the Y direction. A term "thickness" means a length in the Z direction in principle in the following description. A term "plan view" means viewing of the X-Y plane in principle in the following description.

The semiconductor device PKG1 according to the present embodiment includes a semiconductor chip 10 (see FIGS. 3 and 4), a die pad (metal plate, chip mounting portion, heat sink) 20 on which the semiconductor chip 10 is mounted (see FIGS. 2 to 4), a plurality of leads (terminals) 30 as external terminals, and a plurality of wires 12 (see FIG. 3).

As illustrated in FIG. 3, the die pad 20 includes an upper surface (surface) 20t. The semiconductor chip 10 is mounted on the upper surface 20t of the die pad 20 via a die bonding material 11. The leads 30 are arranged along a chip side 10s1, which is extending in the X direction, of a plurality of sides 10s of the semiconductor chip 10. A plurality of electrode pads (a gate electrode pad GE and a source electrode pad SE illustrated in FIG. 3) arranged on an upper surface (chip surface, surface) 10t of the semiconductor chip 10 is electrically connected with the leads 30 via a plurality of wires. As illustrated in FIGS. 4 and 5, the semiconductor chip 10 and the wires 12 are sealed with a sealing body 40. The semiconductor chip 10, the upper surface 20t of the die pad 20, and inner lead portions (sealed portions) 30M of the leads 30 (see FIG. 4) are sealed with the sealing body 40. The sealing body (resin sealing body, resin body, mold resin) 40 is arranged in contact with the die pad 20 and the inner lead portions 30M of the leads 30.

As illustrated in FIGS. 4 to 6, the semiconductor chip 10 includes the upper surface (main surface, front surface, surface) 10t and a lower surface (main surface, back surface, surface) 10b opposite the upper surface 10t. The semiconductor chip 10 has four sides (chip sides) 10s in plan view as illustrated in FIG. 3. The chip side 10s1 of the four sides 10s of the semiconductor chip 10 is arranged nearest to each of the leads 30, and extends in the X direction. In the example of FIG. 3, the semiconductor chip 10 is rectangular in plan view and is arranged such that the chip side 10s1 as a long side extends in the X direction.

The gate electrode pad GE and the source electrode pad SE are arranged on the upper surface 10t of the semiconductor chip 10. In an insulative film (passivation film) including the upper surface 10t of the semiconductor chip 10, a plurality of openings is arranged. The gate electrode pad GE and the source electrode pad SE are exposed from the insulative film at the openings, respectively. The area of the source electrode pad SE is larger than the area of the gate electrode pad GE. The gate electrode pad GE is an electrode pad connected with a gate electrode G of a transistor Q1 illustrated in FIG. 7 described later. The source electrode pad SE is an electrode pad connected with a source S of the transistor Q1 illustrated in FIG. 7 described later.

As illustrated in FIGS. 4 to 6, a drain electrode DE is arranged on the lower surface 10b of the semiconductor chip 10. The drain electrode DE is an electrode pad connected with a drain D of the transistor Q1 illustrated in FIG. 7 described later. In the example of FIGS. 4 to 6, the entire lower surface 10b of the semiconductor chip 10 serves as the drain electrode DE. Note that a vertical-channel MOSFET is exemplified as an example of the transistor Q1 in the present embodiment. Thus, the drain electrode DE is arranged to be close to the lower surface 10b of the semiconductor chip 10. If a horizontal-channel MOSFET is used as a modification example of the present embodiment although not illustrated, the gate electrode pad GE, the source electrode pad SE, and the drain electrode (drain electrode pad) DE are arranged on the upper surface 10t of the semiconductor chip 10.

As illustrated in FIGS. 3 to 6, the semiconductor device PKG1 includes the die pad (metal plate, chip mounting portion, heat sink) 20 on which the semiconductor chip 10 is mounted. Each of the die pad 20 and the plurality of leads 30 (see FIG. 3) includes a base member 31 made of, for example, copper (Cu) or an alloy material mainly containing copper (Cu). As illustrated in FIGS. 4 to 6, the die pad 20 includes the upper surface (surface, main surface, chip mounting surface) 20t on which the semiconductor chip 10 is mounted via the die bonding material 11, and a lower surface (surface, main surface, back surface, main surface) 20b opposite the upper surface 20t.

In the present embodiment, the die bonding material 11 is made of a conductive material for electrically connecting the drain electrode DE (see FIG. 4) and the die pad 20 with each other. As the conductive die bonding material 11, a resin material containing conductive particles, or a solder material can be exemplified. The resin material containing conductive particles is called conductive resin or conductive paste, and the resin material using silver particles as conductive particles is called silver paste. When an element structure (such as horizontal-channel transistor) in which no electrode is arranged on the lower surface 10b of the semiconductor chip 10 is applied as a modification example of the present embodiment, it is not essential that the die bonding material 11 has the conductivity. In this case, a material not containing the conductive particles, such as a resin adhesive, can be used. Although not illustrated, a metal film (not illustrated) which is more adhesive to the die bonding material 11 than the copper (Cu) or the copper alloy as the base member of the die pad 20 may be arranged on part (entire or part of a region R1 of FIG. 9 described later) of the upper surface 20t of the die pad 20. Therefore, bonding strength between the die bonding material 11 and the die pad 20 can be improved.

As illustrated in FIG. 2, the die pad 20 has four sides 20s in plan view. More specifically, the die pad 20 has a side 20s1 extending in the X direction, a side 20s2 opposite the side 20s1, a side 20s3 extending in the Y direction and crossing the side 20s1, and a side 20s4 opposite the side 20s3 and crossing the side 20s1. The die pad 20 includes a main portion 20P1 including the region R1 (see FIG. 9 described later) overlapping the semiconductor chip 10 (see FIG. 3), a header portion 20P2 including the side 20s2 opposite the side 20s1 in plan view, and a connecting portion 20P3 which connects the main portion 20P1 and the header portion 20P2 with each other. The sides 20s1, 20s3, and 20s4 are the sides of the main portion 20P1 of the die pad 20. The side 20s2 is a side of the header portion 20P2 of the die pad 20.

The main portion 20P1 is a region including a region on which the semiconductor chip 10 (see FIG. 3) is to be mounted and a region to be contacted with a jig configured to fix the die pad 20 in a step of bonding the wires 12 to the semiconductor chip 10 (wire bonding step described later). The main portion 20P1 has a quadrangular shape in plan view. In the example of FIG. 2, the main portion 20P1 has a rectangular shape, and the side 20s1 is a long side. The semiconductor chip 10 is arranged such that the chip side 10s1 and the side 20s1 of the die pad 20 extend in parallel with each other in plan view.

The header portion 20P2 is unified with the main portion 20P1 and the connecting portion 20P3. However, the semiconductor chip 10 is not mounted on the header portion 20P2. The side 20s2 and its periphery of the header portion 20P2 are exposed from the sealing body 40. The header portion 20P2 exposed from the sealing body 40 and the main portion 20P1 are unified with each other, and therefore, a heat sink property of the semiconductor device PKG1 is improved. In other words, the header portion 20P2 functions as a heat sink fin of the semiconductor device PKG1.

The connecting portion 20P3 is a portion used for connecting the header portion 20P2 and the main portion 20P1 with each other. Incidentally, as illustrated in FIG. 2, a width WP3 of the connecting portion 20P3 is smaller than a width WP1 of the main portion 20P1. The width WP3 of the connecting portion is smaller than a width WP2 of the header portion 20P2. In the example of FIG. 2, the width WP1 is the same as the width WP2. The "width WP1" herein corresponds to a length between one side 20s3 of the main portion 20P1 and the other side 20s4 opposite the side 20s3 in the X direction in FIG. 2. The "width WP2" herein corresponds to a length between one side of the header portion 20P2 and the other side opposite thereto in the X direction in FIG. 2. The "width WP3" herein corresponds to a length between one side of the connecting portion 20P3 and the other side opposite thereto in the X direction in FIG.

2. The connecting portion 20P3 having the width WP3 smaller than the width WP1 and the width WP2 is arranged between the main portion 20P1 and the header portion 20P2 in the die pad 20, and thus, a planar shape of the die pad 20 is narrower at the connecting portion 20P3 in plan view. The sealing body 40 is embedded in the narrower part of the die pad 20. Since the sealing body 40 is embedded in the narrower portion of the die pad 20, the peeling between the sealing body 40 and the die pad 20 can be suppressed.

As illustrated in FIGS. 2 and 4 to 6, the lower surface 20b of the die pad 20 is exposed from the sealing body 40. In the example of FIG. 2, the area of the lower surface 20b of the die pad 20 is equal to or larger than the area of the lower surface 40b of the sealing body 40. Since the lower surface 20b of the die pad 20 is exposed from the sealing body 40, the heat sink property of the die pad 20 can be improved. When the die pad 20 is bonded to a terminal of a mounting substrate although not illustrated, the die pad 20 itself can be used as a drain terminal (or collector terminal for IGBT).

The thickness of the die pad 20 (or a length of the die pad in the Z direction) is preferably large in order to increase a heat capacity of the die pad 20 or increase a cross-sectional area of a conductive path through which current flows. In the example of FIGS. 4 to 6, the thickness of the die pad 20 is larger than the thickness of the semiconductor chip 10. The thickness of the die pad 20 (the distance between the upper surface 20t and the lower surface 20b) is larger than the thickness of the lead 30 (the distance between an upper surface 30t and a lower surface 30b). For example, in the example of FIGS. 4 to 6, the thickness of the die pad 20 is about 500 μm to 2000 μm.

A part (outer portion, exposed portion) of the die pad 20, the part being exposed from the sealing body 40, is covered with a metal film 22. Similarly, a part (outer lead portion 30X) of each of the leads 30, the part being exposed from the sealing body 40, is covered with a metal film 32. The metal film 22 and the metal film 32 are metal films used for improving wettability of a solder material used as a connecting material when the semiconductor device PKG1 is mounted on the mounting substrate. The metal film 22 is a plated metal film formed by, for example, a plating method. On the other hand, the metal film 32 is a metal film formed by so-called solder dipping method of dipping each of the leads 30 into a molten solder solution in steps of manufacturing the semiconductor device. As described below in more details, in the present embodiment, the metal film 22 is a plated film containing, for example, nickel (Ni) while the metal film 32 is a solder film made of, for example, a solder material containing tin (Sn).

As illustrated in FIGS. 3 to 6, the semiconductor device PKG1 includes the leads 30 electrically connected with the semiconductor chip 10. As illustrated in FIG. 3, each of the leads 30 faces the side 20s1 of the die pad 20 in plan view. However, as illustrated in FIGS. 4 and 5, the lower surfaces 30b of the leads 30 are positioned higher than the upper surface 20t of the die pad 20 in the Z direction. Thus, in the cross-sectional views of FIGS. 4 and 5, the lead 30 does not face the side 20s1 of the die pad 20. The phrase "the leads 30 face the side 20s1 of the die pad 20 in plan view" means that the leads 30 seem to face the side 20s1 of the die pad 20 in plan view as illustrated in FIG. 3. Thus, as illustrated in FIGS. 4 and 5, the end surfaces of the leads 30 may do not face the end surface of the die pad 20. Although not illustrated, a case that is a modification example of the present embodiment in which the end surfaces of the leads 30 face the end surface of the die pad 20 is included in the phrase "the leads 30 face the side 20s1 of the die pad 20 in plan view".

The leads 30 include a source lead (source terminal) 30S, a drain lead (drain terminal) 30D, and a gate lead (gate terminal) 30G. In the example of FIG. 3, the leads 30 are arranged in the X direction. In the example of FIG. 3, the lead 30G, the lead 30D, and the lead 30S are arranged in this order in the X direction. The order of arrangement is not limited to that in FIG. 3. For example, the lead 30G, the lead 30S, and the lead 30D may be arranged in this order.

As illustrated in FIGS. 4 to 6, each of the leads 30 includes an inner portion 30M sealed with the sealing body 40 and the outer lead portion (outer portion, exposed portion) 30X exposed from the sealing body 40.

As illustrated in FIGS. 3 and 6, the die pad 20 is unified with the lead 30D that is the drain terminal. The lead 30D is an external terminal electrically connected with the drain D of FIG. 7. As illustrated in FIG. 6, the lead 30D is electrically connected with the drain electrode DE of the semiconductor chip 10 via the die pad 20 and the die bonding material 11. The lead 30D is connected (coupled) with the die pad 20, and thus, functions as a suspending lead configured to support the die pad 20 in the steps of manufacturing the semiconductor device described later.

As illustrate in FIG. 3, the gate electrode pad GE of the semiconductor chip 10 is electrically connected with the lead 30G via the wire (conductive member, metal wire) 12 (more specifically, the gate wire 12G). Similarly, the source electrode pad SE of the semiconductor chip 10 is electrically connected with the lead 30S via the wires 12 (more specifically, source wires 12S). The wires 12 are conductive members configured to connect the electrode pads on the upper surface 10t of the semiconductor chip 10 and the leads 30, and mainly contain a metal such as aluminum (Al), copper (Cu), silver (Ag), or gold (Au).

As illustrated in FIG. 4, one end of the source wire 12S is bonded to the source electrode pad SE of the semiconductor chip 10. The other end of the wire 12S opposite the end is bonded to a metal film 33S covering a wire bonding region 30W of the lead 30S. As illustrated in FIG. 5, one end of the gate wire 12G is bonded to the gate electrode pad GE of the semiconductor chip 10. On the other hand, the other end of the wire 12G opposite the end is bonded to a metal film 33G covering the wire bonding region 30W of the lead 30G. The metal film 33S and the metal film 33G are films made of, for example, nickel (Ni) or silver (Ag). Since the wire 12 is boded to the metal film 33 covering the wire bonding region 30W, the bonding strength between the wire 12 and the lead 30 can be improved.

In a power semiconductor device, larger current flows in a wiring path connected with the source electrode pad SE than in a wiring path connected with the gate electrode pad GE. Thus, in the example of FIG. 3, the wires 12S are connected with the source electrode pad SE. Note that the shape and the number of the wires 12 are not limited to those in FIG. 3, and may be variously modified. For example, the wire 12S may be thicker than the wire 12G. Alternatively, a belt-shaped conductive member may be used as the wire 12S. As examples of the belt-shaped conductive member, a metal ribbon made of aluminum (Al), a metal plate made of copper (Cu) and others are exemplified. Alternatively, for example, the number of wires 12G may be equal to the number of wires 12S.

The semiconductor chip 10, the inner lead portions 30M of the leads 30, and the wires 12 are sealed with the sealing body 40. The sealing body 40 is a resin body configured to seal the semiconductor chip 10 and the wires 12, and includes an upper surface 40t (see FIGS. 1 and 4) and a lower surface (mounting surface) 40b (see FIGS. 2, 4, and 5) opposite the upper surface 40t. As illustrated in FIGS. 1 and 2, the upper surface 40t (see FIG. 1) and the lower surface 40b (see FIG. 2) of the sealing body 40 each has a plurality of sides 40s on their peripheries.

The sealing body 40 is mainly made of, for example, thermoset resin such as epoxy-based resin. In the present embodiment, filler particles such as silicon dioxide ($SiO_2$) particles are mixed into the resin material in order to improve the properties (such as thermally-affected expansion property) of the sealing body 40.

<Exemplary Circuit Structure>

Figure 7:
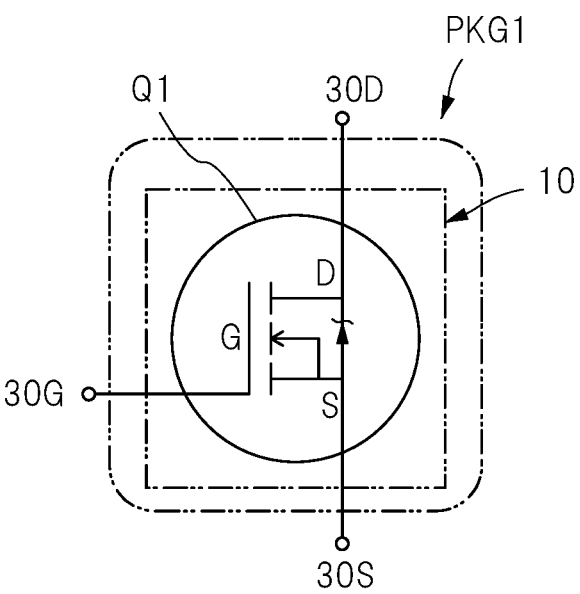
FIG. 7 is a schematic explanatory diagram of one exemplary circuit included in the semiconductor device of FIG. 1.
Figure 8:
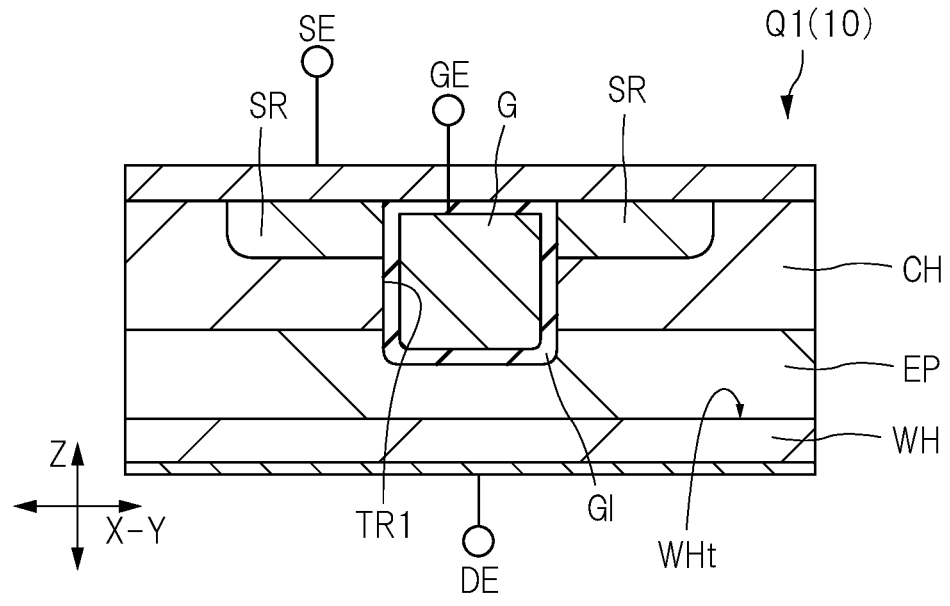
FIG. 8 is a cross-sectional view of principal parts illustrating an exemplary element structure of a field effect transistor of FIG. 7.

Next, an exemplary structure of a circuit included in the semiconductor device PKG1 of FIG. 3 and an exemplary element structure of the transistor will be described. FIG. 7 is a schematic explanatory diagram of an exemplary circuit included in the semiconductor device of FIG. 1. FIG. 8 is a cross-sectional view of principal parts illustrating an exemplary element structure of a field effect transistor of FIG. 7.

A control power semiconductor device called power semiconductor device may include a semiconductor element such as diode, thyristor, or transistor. The transistor is used in various fields, and a transistor operating as a switching device and embedded in a power controller circuit through which large current of, for example, 1 A or more flows as in the present embodiment, is called power transistor. The semiconductor device PKG1 according to the present embodiment includes the semiconductor chip 10 including the transistor Q1 that is the power transistor as illustrated in FIG. 7. In the example of FIGS. 7 and 8, the transistor Q1 included in the semiconductor chip 10 is a field effect transistor, more specifically a metal oxide semiconductor field effect transistor (MOS FET). The transistor in the power semiconductor device is utilized as, for example, the switching device. The MOSFET used in the power semiconductor device is called power MOSFET.

The term MOSFET is described as a term widely representing a field effect transistor in which a gate electrode made of a conductive material is arranged on a gate insulative film. Thus, even the term MOSFET does not exclude the gate insulative film other than the oxide film. The term MOSFET does not exclude the gate electrode material such as polysilicon other than the metal.

The transistor Q1 of FIG. 7 is made of, for example, an n-channel field effect transistor as illustrated in FIG. 8. FIG. 8 is a cross-sectional view of principal parts illustrating an exemplary element structure of the field effect transistor of FIG. 7.

In the example of FIG. 8, for example, an n-type epitaxial layer EP is formed on a main surface WHt of a semiconductor substrate WH made of n-type silicon. The semiconductor substrate WH and the epitaxial layer EP configure a drain region (corresponding to the drain D of FIG. 7) of the MOSFET. The drain region is electrically connected with the drain electrode DE formed on the back surface of the semiconductor chip 10.

A channel forming region CH that is a $p^+$-type semiconductor region is formed on the epitaxial layer EP, and a source region (corresponding to the source S of FIG. 7) SR that is an $n^+$-type semiconductor region is formed on the channel forming region CH. The source region SR is electrically connected with the source electrode pad SE formed on the main surface of the semiconductor chip 10 via a drawn-out wiring. A trench (opening, groove) TR1, which penetrates through the channel forming region CH from an upper surface of the source region SR and reaches inside the epitaxial layer EP, is formed in a semiconductor region stacked on the semiconductor substrate WH.

A gate insulative film G1 is arranged on the inner wall of the trench TR1. The gate electrode G stacked to fill the trench TR1 is arranged on the gate insulative film G1. The gate electrode G is electrically connected with the gate electrode pad GE of the semiconductor chip 10 via a drawn-out wiring.

In the transistor Q1, the drain region and the source region SR are arranged across the channel forming region CH in the thickness direction, and thus channels are formed in the thickness direction (this will be called vertical-channel structure). In this case, the element-occupying area in plan view can be made smaller than that of a field effect transistor in which channels are formed along the main surface WHt. Thus, the plane size of the semiconductor chip 10 can be reduced.

In the vertical-channel structure, a channel width per unit area in plan view can be increased, and therefore, an ON resistance can be reduced. FIG. 8 is a diagram illustrating an element structure of a field effect transistor in which a plurality of (a large number of) transistors Q1 having, for example, the element structure of FIG. 8 is connected in parallel in the semiconductor chip 10 of FIG. 7. Therefore, the power MOSFET in which the large current exceeding, for example, 1 A flows can be configured.

When the MOSFET is configured by the parallel connection of the plurality of transistors Q1 having the vertical-channel structure as described above, electric properties (mainly withstand voltage property, ON resistance property, and capacity property) of the MOSFET varies depending on the plane size of the semiconductor chip 10. For example, the larger the plane area of the semiconductor chip 10 is, the larger the number of cells (or the number of elements) of the transistors Q1 connected in parallel is, and therefore, the ON resistance decreases while the capacity increases.

In FIGS. 7 and 8, the MOSFET is exemplified as the power transistor included in the power semiconductor device. However, various modification examples are applicable. For example, instead of the MOSFET, an insulated gate bipolar transistor (IGBT) may be included.

In the example of FIG. 8, the transistor having the vertical-channel structure has been exemplified and described. However, a transistor having a horizontal-channel structure may be instead used. In this case, the drain electrode DE is arranged on the upper surface 10t of the semiconductor chip 10 (see FIG. 3). Thus, the drain lead 30D of FIG. 3 is electrically connected with the drain electrode DE (see FIG. 8) connected with a drain of the transistor having the horizontal-channel structure via a wire (drain wire) not illustrated. A region (wire bonding region) of the drain lead 30D, the region being connected with the drain wire, is covered with the metal film 33 as similar to in FIGS. 4 and 5, and the drain wire is connected to the drain lead 30D via the metal film 33.

<Die Pad>

Figure 9:
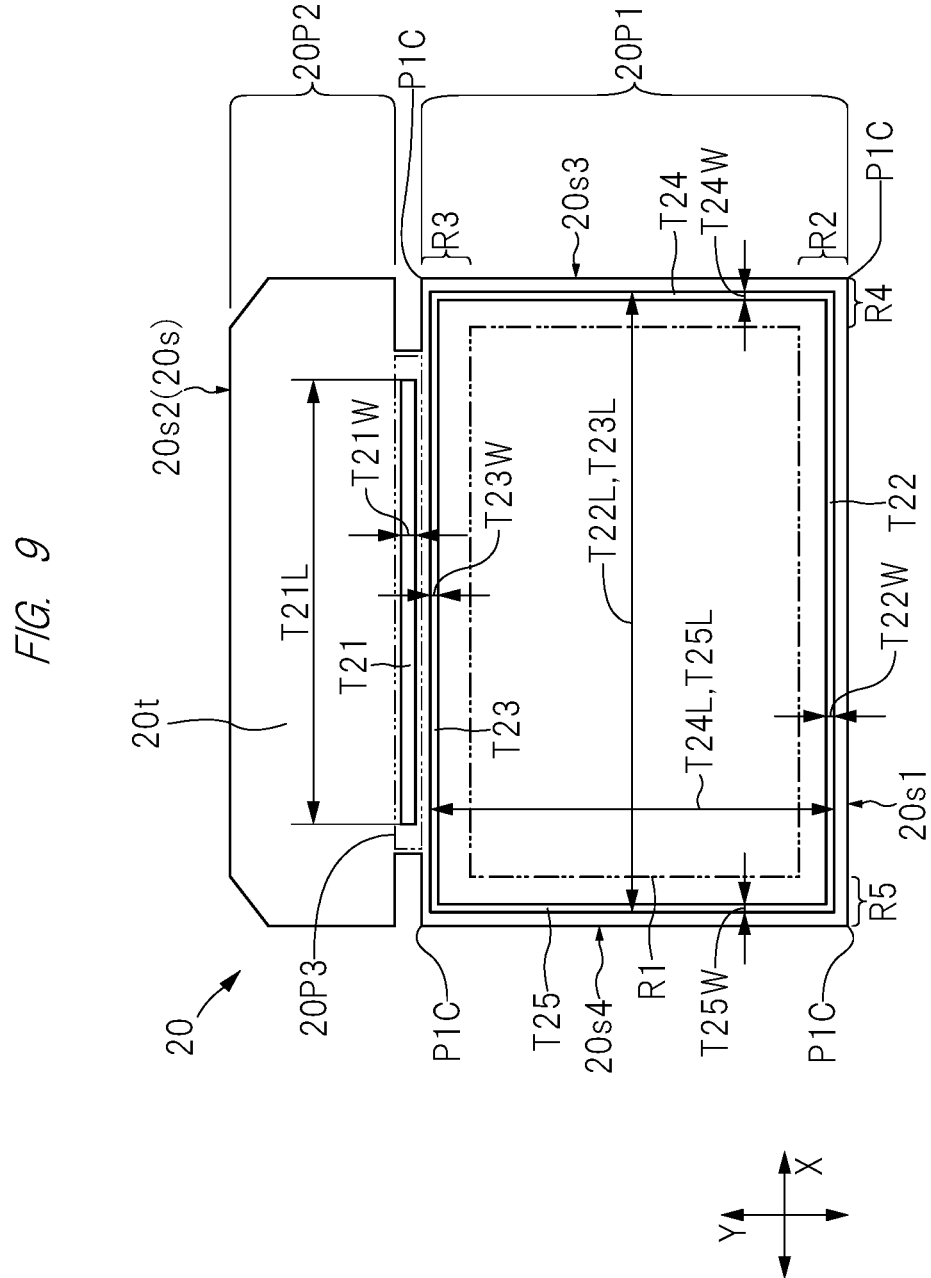
FIG. 9 is a plan view of a die pad of FIG. 3.

Next, a detailed structure of the die pad will be described. FIG. 9 is a plan view of the die pad of FIG. 3.

In the example of FIG. 9, the upper surface 20t of the die pad 20 includes the region R1 overlapping the semiconductor chip 10 (see FIG. 3), a region R2 arranged between the side 20s1 and the region R1, a region R3 arranged between the region R1 and the connecting portion 20P3, a region R4 arranged between the side 20s3 and the region R1, and a region R5 arranged between the side 20s4 and the region R1.

A trench T21 arranged in the connecting portion 20P3, and extending in the X direction, a trench T22 arranged in the region R2 of the main portion 20P1, and extending in the X direction, a trench T23 arranged in the region R3 of the main portion 20P1, and extending in the X direction, a trench T24 arranged in the region R4 of the main portion 20P1, and extending in the Y direction, and a trench T25 arranged in the region R5 of the main portion 20P1, and extending in the Y direction are arranged on the upper surface 20t of the die pad 20.

The trench T21 has a trench length T21L that is a length of the trench in the X direction and a trench width T21W that is a length of the trench in the Y direction crossing the X direction. The trench T22 has a trench length T22L that is a length of the trench in the X direction and a trench width T22W that is a length of the trench in the Y direction. The trench T23 has a trench length T23L that is a length of the trench in the X direction and a trench width T23W that is a length of the trench in the Y direction. The trench T24 has a trench length T24L that is a length of the trench in the Y direction and a trench width T24W that is a length of the trench in the X direction. The trench T25 has a trench length T25L that is a length of the trench in the Y direction and a trench width T25W that is a length of the trench in the X direction.

The trench length T22L and the trench length T23L are larger than the trench length T21L. The trench width T22W, the trench width T23W, the trench width T24W, and the trench width T25W are smaller than the trench width T21W.

As illustrated in FIGS. 4 to 6, the sealing body 40 is in contact with the upper surface 20t of the die pad 20. In this case, it is necessary to suppress or prevent the peeling between the die pad 20 and the sealing body 40. When the sealing body 40 and the die pad 20 separate from each other at their contact interface, the peeling region gradually expands. The phenomenon is called growth of peeling. If the peeling grows and reaches the die bonding material 11, the die bonding material 11 may be cracked. The die bonding material 11 serves as a heat sink path or a current path (such as drain current path) of the semiconductor device PKG1. Thus, the cracking of the die bonding material 11 causes a deterioration in performance of the semiconductor device (such as a deterioration in heat sink property or a deterioration in electric property along with an increase in resistance).

According to studies of the present inventors, the peeling between the die pad 20 and the sealing body 40 occurs and grows as follows. The main portion 20P1 of the die pad 20 has the quadrangular shape in plan view as illustrated in FIG. 9. In this case, stress concentrates on the four corners of the quadrangular shape. As a result, the peeling between the die pad 20 and the sealing body 40 (see FIG. 4) occurs in periphery of any of the four corners of the quadrangular shape (a peripheral region of corner of the main portion is called corner part below). Thereafter, the peeling region grows toward the center of the main portion 20P1, in other words, toward the center of the region R1 of FIG. 9. Thus, if a structural object capable of preventing the growth of the pealing is arranged between the four corners of the quadrangular shape and the region R1, the damage on the die bonding material 11 can be prevented.

The trench T21 of FIG. 9 is a trench used for suppressing the peeling between the sealing body 40 and the die pad 20 by increasing the contact area between the sealing body 40 and the die pad 20. A resin component making the sealing body 40 may be called resin, and a trench such as the trench T21 may be called resin lock trench. The trench T21 can be shaped by, for example, a pressing process using a mold in a lead frame preparing step described later. The trench T21 is formed in the connecting portion 20P3. Thus, when the die pad 20 and the sealing body 40 peel at their contact interfaces in the header portion 20P2, the growth of the peeling can be stopped by the trench T21. Therefore, if the peeling occurs in the header portion 20P2, the peeling is difficult to reach the region R1 of the main portion 20P1.

However, the case of the peeling occurring at the corner part of the main portion 20P1 having the quadrangular shape and growing toward the region R1 as described above does not provide the growth suppression effect made by the trench T21 arranged in the connecting portion 20P3. This is because the trench T21 is not arranged in the path through which the peeling grows.

A difference between the area of the region R1 and the area of the quadrangular shape of the main portion 20P1 is small in order to meet a requirement to downsize the semiconductor device. For example, in the example of FIG. 9, the shortest distance between the side 20s1 and the region R1, the shortest distance between the side 20s3 and the region R1, and the shortest distance between the side 20s4 and the region R1 are about 500 μm to 800 μm. When a trench such as the trench T21 is formed by the pressing process, its width and depth are made large. For example, the trench width T21W of the trench T21 of FIG. 9 is about 200 μm to 300 μm. A trench depth T21D of the trench T21 of FIG. 4 is, for example, about 200 μm. In the case of the pressing process, the periphery of the trench T21 also easily deform, and tends to decrease in flatness. Thus, a wide trench such as the trench T21 is difficult to be formed in the region R2, the region R3, the region R4, and the region R5 illustrated in FIG. 9.

In the present embodiment, any of the trench T22, the trench T23, the trench T24, and the trench T25, which have a smaller trench width than the trench width T21W, is arranged in the region R2, the region R3, the region R4, and the region R5, respectively. The trench T22, the trench T23, the trench T24, and the trench T25 are formed by, for example, laser irradiation on the upper surface 20t of the die pad 20 of the main portion 20P1 in the lead frame preparing step described later. In the case of the formation of the trench by the laser irradiation, the trench width and the trench depth can be accurately adjusted by adjustment of laser output. The trench width T22W, the trench width T23W, the trench width T24W, and the trench width T25W are smaller than the trench width T21W and are, for example, about 10 μm to 80 μm. A trench depth T22D of the trench T22 and a trench depth T23D of the trench T23 illustrated in FIG. 4 are smaller than the trench depth T21D of the trench T21 and are, for example, about 5 μm to 30 μm. Note that a trench depth of the trench T24 and a trench depth of the trench T25 illustrated in FIG. 9 are not illustrated. However, these depths are the same as the trench depth T22D and the trench depth T23D and are, for example, about 5 μm to 30 μm.

The trench length T22L and the trench length T23L illustrated in FIG. 9 are larger than the trench length T21L and extend near the corner PIC of the main portion 20P1. The trench length T22L and the trench length T23L are, for example, about less than 5 mm. Since the width WP1 of the main portion 20P1 of FIG. 2 in the X direction is about 5 mm, the trench length T22L and the trench length T23L are smaller than the width WP1 by about several tens of μm to several hundreds of μm. In other words, both ends of the trench T22 and the trench T23 are arranged near the corner PIC of the main portion 20P1 in the die pad 20. Thus, even when peeling occurs at the corner PIC of the main portion 20P1, growth of the peeling can be stopped by any of the trench T22 and the trench T23.

As described above, peeling in the main portion 20P1 grows from the corner PIC of the main portion 20P1 toward the center of the main portion 20P1. Thus, the following structure is preferable in a viewpoint of stopping the growth of peeling by the arrangement of the trenches. That is, any of the trench T22, the trench T23, the trench T24, and the trench T25 may be arranged in the shortest path from each of the four corners PIC of the quadrangular shape of the main portion 20P1 to the region R1.

In the example of FIG. 9, the trench T22, the trench T23, the trench T24, and the trench T25 are arranged to surround the region R1 and are mutually coupled. In this case, the peeling reaches any of the trench T22, the trench T23, the trench T24, and the trench T25 before reaching the region R1 irrespective of a path through which the peeling grows, and therefore, the growth of the peeling can be accurately stopped.

<Modification Examples of Die Pad>

Figure 10:
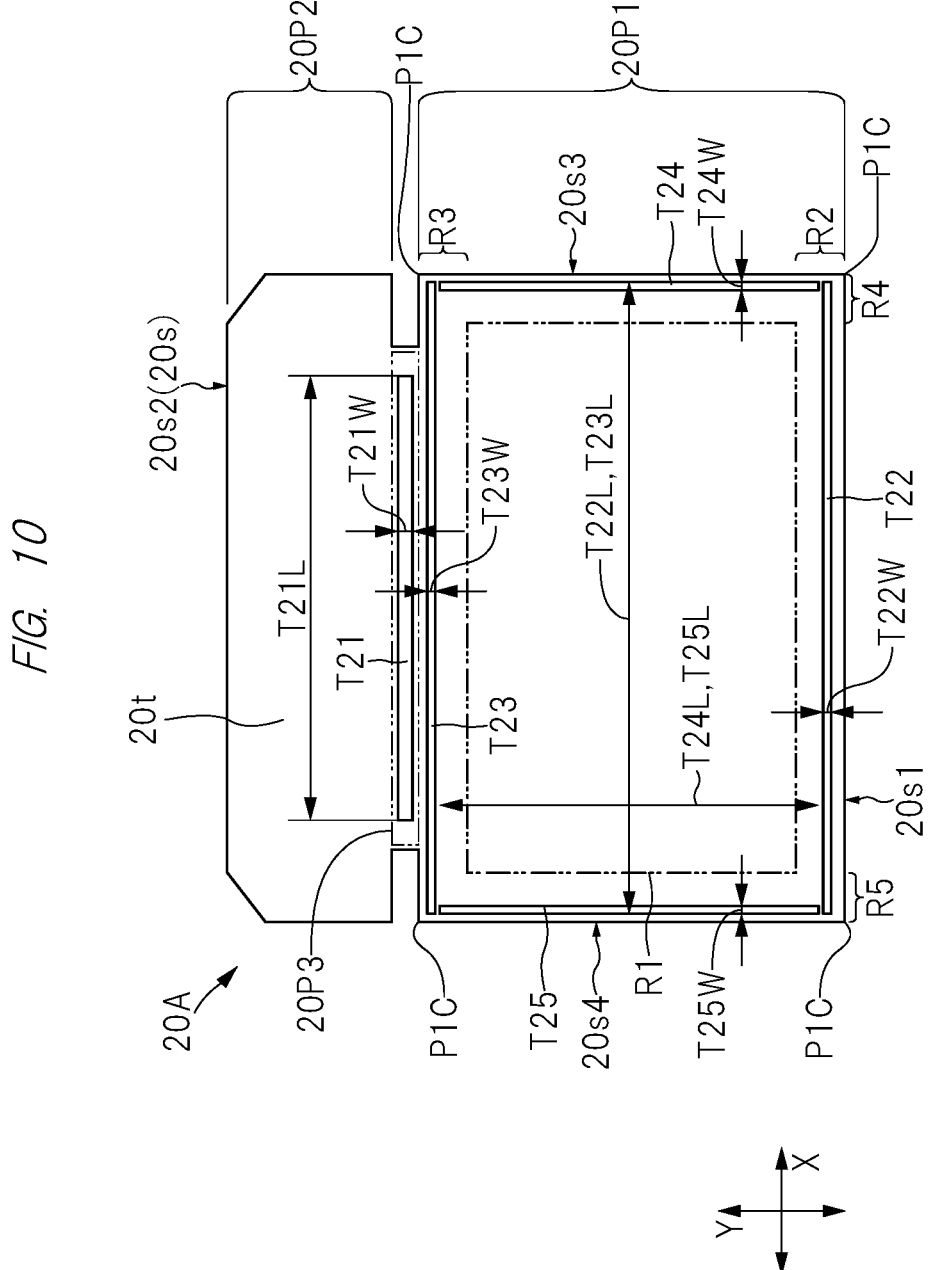
FIG. 10 is a plan view of a modification example of the die pad of FIG. 9.
Figure 11:
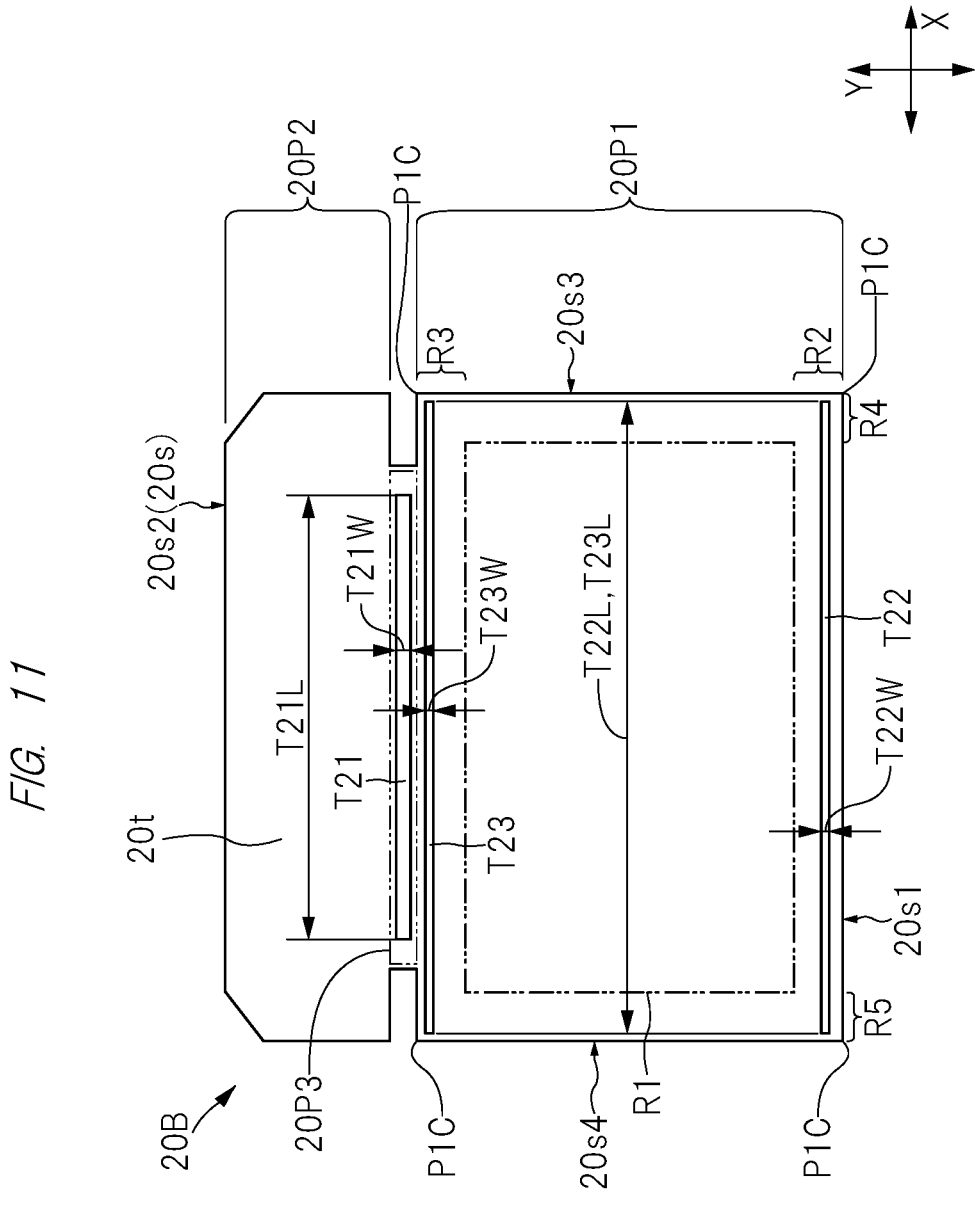
FIG. 11 is a plan view of another modification example of the die pad of FIG. 9.

Next, modification examples of the die pad of FIG. 9 will be described. FIG. 10 is a plan view of a modification example of the die pad of FIG. 9. FIG. 11 is a plan view of another modification example of the die pad of FIG. 9. Note that cross-sectional structures of the trench T21, the trench T22, the trench T23, the trench T24, and the trench T25 illustrated in FIGS. 10 and 11 are similar to those of the trench T21, the trench T22, and the trench T23 described with reference to FIG. 4, and will not be illustrated.

A die pad 20A of FIG. 10 is different from the die pad 20 of FIG. 9 in that the trench T22, the trench T23, the trench T24, and the trench T25 are mutually separated and are not mutually coupled. A die pad 20B of FIG. 11 is different from the die pad 20 of FIG. 9 in that the trench T24 and the trench T25 are not provided. The trench T22 and the trench T23 of the die pad 20A of FIG. 10 and the die pad 20B of FIG. 11 are different from the trench T22 and the trench T23 of the die pad 20 of FIG. 9 in that they are closer to the peripheries (the side 20s1 and the border with the connecting portion 20P3) of the main portion 20P1 than those of the example of FIG. 9. The trench T22 and the trench T23 of the die pad 20A of FIG. 10 and the die pad 20B of FIG. 11 are different from the trench T22 and the trench T23 of the die pad 20 of FIG. 9 in that the trench length T22L and the trench length T23L are larger than those of the example of FIG. 9. Further, the trench T22 and the trench T23 of the die pad 20A of FIG. 10 are different from the trench T22 and the trench T23 of the die pad 20 of FIG. 9 in that the trench length T24L and the trench length T25L are smaller than those of the example of FIG. 9.

If the modification examples of FIG. 10 or FIG. 11 also have the structure in which the peeling reaches any of the trench T22, the trench T23, the trench T24 (see FIG. 10), and the trench T25 (see FIG. 10) before reaching the region R1, the growth of the peeling can be stopped by the trench T22, the trench T23, the trench T24, and the trench T25.

For example, in the examples of FIGS. 10 and 11, the trench T22 or the trench T23 is arranged in the shortest path from each of the four corners PIC of the quadrangular shape of the main portion 20P1 to the region R1. In this case, the growth of peeling is highly possibly stopped by the trench T22 or the trench T23 before reaching the region R1.

As described in detail below, in the die pad 20B of FIG. 11, a jig can be contacted with the region R4 and the region R5 without the trenches in a wire bonding step described later. In the use of the die pad 20B, the die pad can be more securely fixed than a case of the jig contacted with the die pad with the trenches in the region R4 and the region R5.

However, the structure of the die pad 20 of FIG. 9 is particularly preferable in consideration of a possibility of not direct growth of the peeling from the corners PIC of the main portion 20P1 toward the region R1 but detour growth of the same behind the trenches.

The die pad 20A of FIG. 10 and the die pad 20B of FIG. 11 are similar to the die pad 20 of FIG. 9 except the above differences, and the description thereof will not be repeated.

<Example Study of Die Pad>

Figure 12:
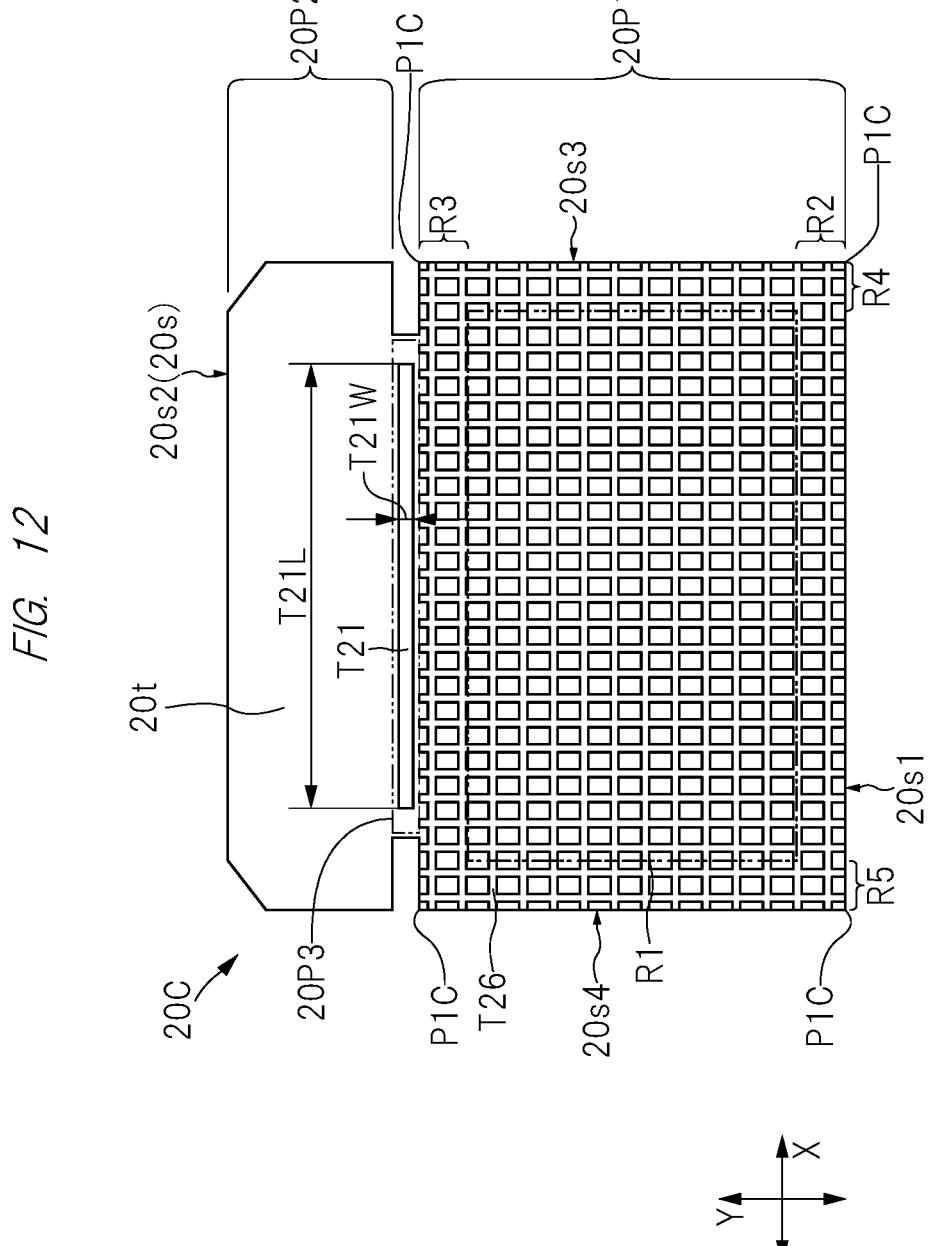
FIG. 12 is a plan view of a study example of the die pad of FIG. 9.

Next, a study example of the die pad 20 will be described. FIG. 12 is a plan view of a study example of the die pad of FIG. 9. A die pad 20C of FIG. 12 is different from the die pad 20 of FIG. 9 in that a grid trench T26 is formed over the region R1, the region R2, the region R3, the region R4, and the region R5. In other words, in the case of the die pad 20C, the grid trench T26 is formed on the entire upper surface 20t of the main portion 20P1. A portion of the grid trench T26, the portion extending in the X direction, has the similar cross-sectional shape to the trench T22 and the trench T23 illustrated in FIG. 9. A portion of the grid trench T26, the portion extending in the Y direction, has the similar cross-sectional shape to the trench T24 and the trench T25 illustrated in FIG. 9. The structure of the study example of FIG. 12 can also prevent the peeling in a viewpoint of suppressing the growth of peeling occurring at the corners PIC of the main portion 20P1. This is because the peeling occurring at the corners PIC of the main portion 20P1 inevitably reaches somewhere in the grid trench T26 before reaching the region R1. In the example of FIG. 12, the grid trench T26 is made of a plurality of the portions extending in the X direction and a plurality of the portions extending in the Y direction. However, the extending directions of the trenches configuring the grid trench T26 are not limited to the X direction and the Y direction. For example, the grid trench T26 may be made of a plurality of portions extending in a direction tilted at 90° or less with respect to the X direction or the Y direction.

As a result of the study example of FIG. 12 studied by the present inventors, it has been found that the adoption of the die pad 20C has the following problems. That is, the die bonding material 11 (see FIG. 4) is formed when being hardened after the semiconductor chip 10 (see FIG. 4) is mounted on the paste-like die bonding material 11. When the grid trench T26 is formed in a base member of the region on which the die bonding material 11 is applied, the die bonding material 11 tends to spread over the entire main portion 20P1 due to capillarity of the grid trench T26. In this case, an amount of the usage of the die bonding material 11 increases in order to mount the semiconductor chip 10 thereon. Since the die bonding material 11 spreads over the entire main portion 20P1, a risk of the growth of the peeling to reach the die bonding material 11 increases.

As a method for solving the problems, it is preferable not to form the trenches at least in the region R1. In other words, as illustrated in FIG. 9, the region R1 of the main portion 20P1 is preferably flatter than the region R2 and the region R3. Similarly, the region R1 of the main portion 20P1 is preferably flatter than the region R4 and the region R5. The trench T22 and the trench T23 terminate before reaching preferably the peripheries (the side 20s3 and the side 20s4) of the main portion 20P1 in plan view. Further, the trench T24 and the trench T25 preferably terminate before reaching the peripheries (the side 20s1 and an extended line of the border with the connecting portion 20P3) of the main portion 20P1 in plan view.

In a viewpoint of suppressing the spread of the die bonding material 11 due to the trenches, the trench T22, the trench T23, the trench T24, and the trench T25 illustrated in FIG. 9 are particularly preferable not to be in contact with the die bonding material 11. However, the distances between the peripheries of the main portion 20P1 and the region R1 tend to be shorter as described above, and therefore, the die bonding material 11 may contact the trenches. Also in this case, if the die bonding material 11 does not enter the trenches, the spread of the die bonding material 11 can be suppressed. If no trench is formed in the region R1 as described above, the die bonding material 11 originally does not enter the trenches, and therefore, it is preferable not to form the trench in the region R1 in a viewpoint of suppressing the spread.

<Other Measures Against Peeling for Die Pad>

As a method for preventing the damage on the die bonding material, the present inventors have studied a method of mixing silica (silicon dioxide) particles as a filler into the die bonding material 11. Specifically, the die bonding material 11 contains the silica filler, and is made thick. Therefore, even if the peeling between the die pad 20 and the sealing body 40 reaches the die bonding material 11, the damage on the die bonding material 11 can be suppressed. The thickness of the die bonding material 11 can be adjusted by controlling the amount of application of the die bonding material 11 and an average particle diameter of the silica filler. Thus, when the die bonding material 11 contains the silica filler, the damage on the die bonding material 11 can be suppressed, and therefore, the deterioration in performance of the semiconductor device can be suppressed.

From the study made by the present inventors, it has been found that the resistance against the peeling between the die pad 20 and the sealing body 40 can be improved even when a material not containing halogen that is so-called halogen-free material is used as a material for the sealing body 40.

As described above, the method of forming the trench T21 and the like of FIG. 9 in the main portion 20P1 of the die pad 20 can prevent or suppress the damage on the die bonding material 11 even in a case without execution of the above measures in combination. Thus, this method is more preferable than the method in which the silica filler is mixed into the die bonding material 11 or the method in which the sealing body 40 is made of the halogen-free material in that the semiconductor devices can be manufactured in mass quantities by use of inexpensive and easily available materials.

<Leads>

Figure 13:
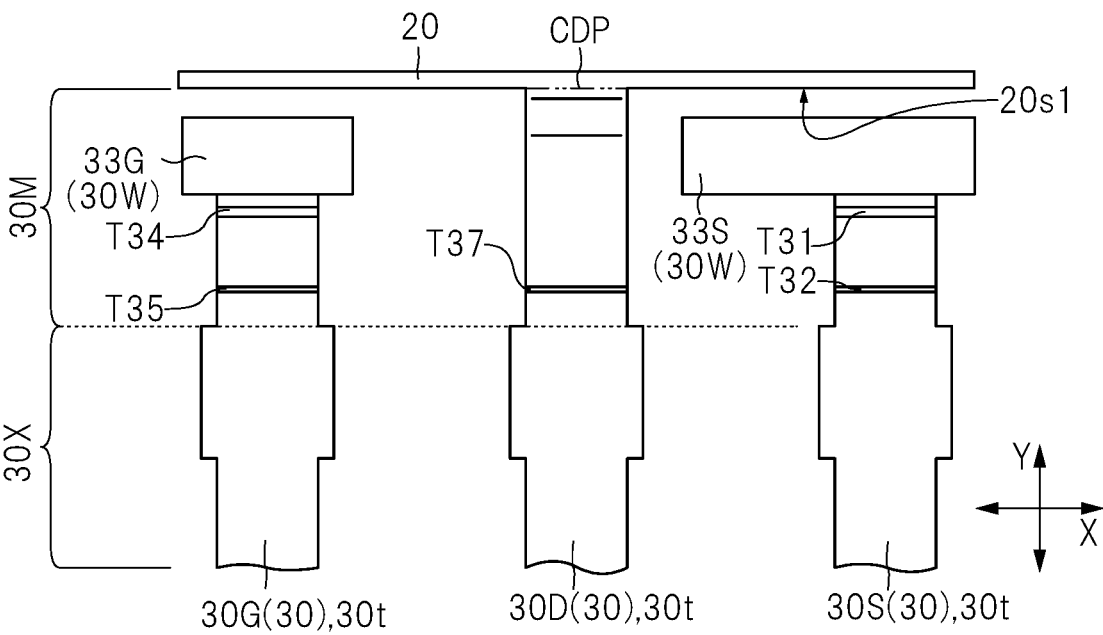
FIG. 13 is an enlarged plan view of peripheries of inner lead portions of a plurality of leads of FIG. 3.
Figure 14:
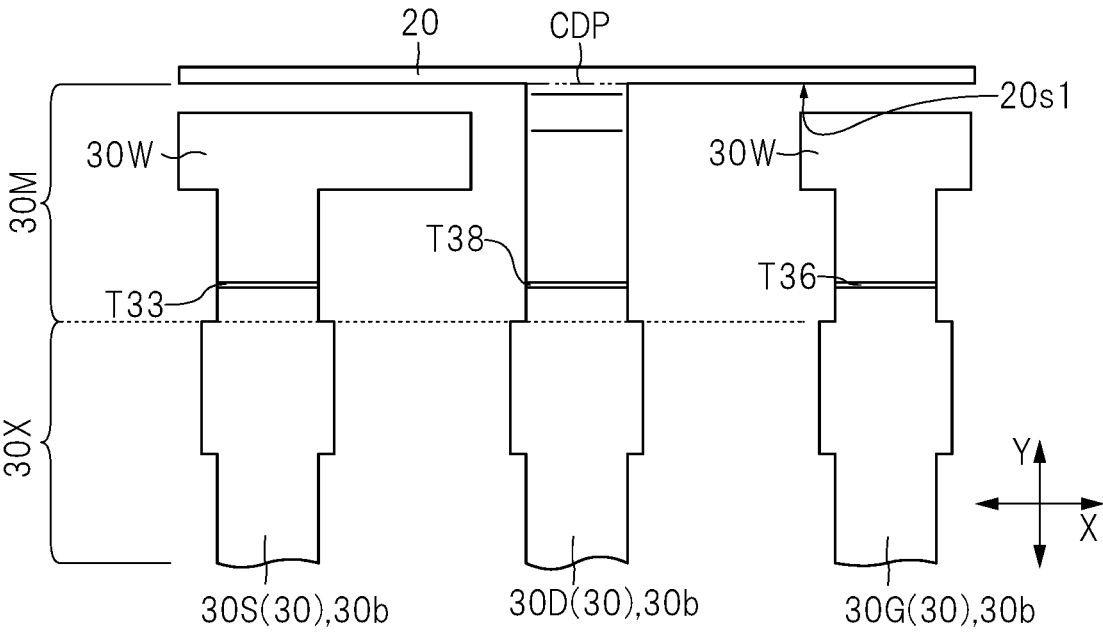
FIG. 14 is an enlarged plan view of a surface opposite a plane of FIG. 13.

Next, detailed structures of the leads 30 of FIG. 3 will be described. Note that a technique described later is a technique for preventing or suppressing growth of peeling between the leads 30 and the sealing body 40. The technique is particularly effective in combination with the techniques for suppressing the growth of the peeling of the die pad described with reference to FIGS. 4 to 6 and FIGS. 9 to 12. Note that this technique is also independently applicable from the above-described techniques for suppressing the growth of the peeling of the die pad. That is, semiconductor devices to which only the above-described techniques for suppressing the growth of the peeling of the die pad are applied or semiconductor devices to which only the following techniques for suppressing the growth of the peeling of the leads are applied are also modification examples of present embodiment. FIG. 13 is an enlarged plan view of peripheries of the inner lead portions of the leads of FIG. 3. FIG. 14 is an enlarged plan view of a surface opposite the plane of FIG. 13.

As illustrated in FIGS. 4 to 6, each of the leads 30 includes the upper surface 30t (lead surface), the lower surface (lead surface) 30b opposite the upper surface 30t, the inner lead portion 30M sealed with the sealing body 40, and the outer lead portion 30X exposed from the sealing body 40. The leads 30 include the lead 30S electrically connected to the source electrode pad SE of the electrode pads via the wire 12S (see FIG. 4) of the wires 12. The upper surface 30t of the lead 30S includes the wire bonding region 30W covered with the metal film 33S to which the wire 12S is bonded. The upper surface 30t includes a lead trench T31 arranged between the outer lead portion 30X and the wire bonding region 30W, and extending in the X direction (see FIG. 13). The upper surface 30t further includes a lead trench T32 arranged between the outer lead portion 30X and the lead trench T31, and having a trench depth shallower than a trench depth of the lead trench T31. The lower surface 30b of the lead 30S includes a lead trench T33 arranged between the outer lead portion 30X and the region opposite the lead trench T31, and having a trench depth shallower than the trench depth of the lead trench T31.

The measures against the peeling between the die pad 20 and the sealing body 40 (including the measures against the growth of the peeling after the peeling occurs) have been described above with reference to FIGS. 3 to 6 and FIGS. 9 to 12. Peeling between a base member making a lead frame and the sealing body 40 may occur also between the leads 30 and the sealing body 40.

For example, when the metal film 33 covering the wire bonding region 30W is made of silver, the metal film 33 made of silver and the sealing body 40 peel, and the peeling may grow to the entire upper surface 30t of the inner lead portion 30M. The lead trench T31 of FIG. 4 and the lead trench T34 of FIG. 5 are trenches provided for stopping the growth of peeling occurring in the wire bonding region 30W. The lead trench T31 and the lead trench T34 are trenches shaped by the pressing process using the mold similarly to the trench T21 formed in the die pad 20. The lead trench T31 and the lead trench T34 are formed in order to stop the growth of peeling occurring in the wire bonding region 30W, and therefore, are formed closer to the wire bonding region 30W than the outer lead portion 30X.

However, according to the studies made by the present inventors, it has been found that the peeling may occur near the border with the outer lead portion 30X in addition to a mode of the peeling starting from the wire bonding region 30W. For example, a solder film forming step described later may adopt a method of forming the metal film 32 (see FIG. 4) made of solder on the surface of the lead frame by dipping the lead frame in which a plurality of product regions is coupled into a molten solder solution. In this case, it has been found that, since the temperature of the molten solder is high (for example, at 300° C.), the peeling may occur near the border between the outer lead portion 30X and the inner lead portion 30M due to the thermal stress caused by the high temperature.

Accordingly, the present inventors have studied a technique for stopping, if happening, the growth of peeling near the border between the outer lead portion 30X and the inner lead portion 30M as described above.

The lead trench T32 and the lead trench T33 are trenches formed in order to stop the growth of peeling near the border between the outer lead portion 30X and the inner lead portion 30M. The lead trench T32 and the lead trench T33 are trenches formed by, for example, irradiating the lead 30 with a laser similarly to the trench T22, the trench T23, the trench T24, and the trench T25 in FIG. 9 described above.

The lead trench T32 and the lead trench T33 are trenches formed in order to stop the growth of peeling near the border between the outer lead portion 30X and the inner lead portion 30M, and therefore, are preferably formed closer to the outer lead portion 30X than the wire bonding region 30W.

Note that the lead trench T32 only needs to be formed between the lead trench T31 and the outer lead portion 30X. Therefore, in a modification example, the lead trench T32 may be arranged closer to the wire bonding region 30W than the outer lead portion 30X.

The peeling possibly occurs on both the upper surface 30t and the lower surface 30b of the lead 30, and therefore, the lead trench T32 is preferably formed on the upper surface 30t while the lead trench T33 is preferably formed on the lower surface 30b. Note that the thickness of the lead 30 (a distance between the upper surface 30t and the lower surface 30b) is smaller than the width of the lead 30 (length in the X direction in FIG. 13). Thus, the peeling, if happening, occurs on either the upper surface 30t or the lower surface 30b of the lead 30, but is less likely to occur on a side surface of the lead 30. Thus, in the present embodiment, the trenches are formed on the upper surface 30t and the lower surface 30b of the lead 30 while no trench is formed on the side surface of the lead 30.

In the present embodiment, even if the peeling occurs on either one or both of the upper surface 30t and the lower surface 30b of the lead 30S near the border between the outer lead portion 30X and the inner lead portion 30M, the growth of the peeling can be stopped at portions where the lead trench T32 and the lead trench T33 are arranged. Thus, even if the molten solder solution contains the halogen element such as chlorine, the halogen element can be suppressed from reaching the source electrode pad SE of the semiconductor chip 10 of FIG. 3.

The measures against the growth of peeling at the source lead 30S have been described above. When the measures against the growth of peeling are taken only for the source lead 30S of the three leads of FIG. 13, the growth of peeling can be suppressed in the lead 30S. For example, when it is confirmed that the lead 30S, which are arranged at a specific position, of the leads 30 tends to frequently peel, the measures against the growth of peeling may be selectively taken for the easily peeling lead 30S.

However, the measures against the growth of peeling similar to those for the source lead 30S is preferably taken also for the gate lead 30G connected to the semiconductor chip 10 via the wire 12 similarly to the source lead 30S. That is, as illustrated in FIG. 5, the leads 30 include the lead 30G electrically connected to the gate electrode pad GE of the electrode pads via the wire 12G of the wires 12. An upper surface 30t of the lead 30G includes the wire bonding region 30W covered with the metal film 33G to which the wire 12G is bonded. The upper surface 30t includes the lead trench T34 arranged between the outer lead portion 30X and the wire bonding region 30W, and extending in the X direction. The upper surface 30t further includes a lead trench T35 arranged between the outer lead portion 30X and the lead trench T34, and having a trench depth shallower than a trench depth of the lead trench T34. A lower surface 30b of the lead 30G includes a lead trench T36 arranged between the outer lead portion 30X and a region opposite the lead trench T34, and having a trench depth shallower than the trench depth of the lead trench T34.

The lead trench T34 of FIG. 5 is a trench for preventing the peeling between the metal film 33G made of silver and the sealing body 40 and the growth of the peeling to the entire upper surface 30t of the inner lead portion 30M, and corresponds to the lead trench T31 of FIG. 4. The lead trench T34 is shaped by, for example, the pressing process using the mold. On the other hand, the lead trench T35 and the lead trench T36 illustrated in FIG. 5 are trenches for suppressing the peeling, if happening, near the border between the outer lead portion 30X and the inner lead portion 30M and the growth of the peeling to the wire bonding region 30W, and correspond to the lead trench T32 and the lead trench T33 illustrated in FIG. 4, respectively. The lead trench T35 and the lead trench T36 are trenches formed by, for example, irradiating the lead 30G with a laser. The lead trench T35 and the lead trench T36 each has a trench depth shallower than the trench depth of the lead trench T34. As illustrated in FIG. 5, the lead trench T35 is arranged closer to the outer lead portion 30X than to the wire bonding region 30W. The lead trench T36 is formed closer to the outer lead portion 30X than to the region opposite the wire bonding region 30W.

A trench for the measures against the growth of peeling is preferably formed also in the lead 30D in a viewpoint of taking the measures against the growth of peeling for all the leads 30. As illustrated in FIG. 13, the leads 30 include the lead 30D coupled to the side 20s1 of the die pad 20. And, as illustrated in FIG. 6, the upper surface 30t of the lead 30D includes a connection region CDP connected to the die pad 20 and a lead trench T37 arranged between the outer lead portion 30X and the connection region CDP, and having a trench depth shallower than the trench depth of the lead trench T31. The lower surface 30b of the lead 30D includes a lead trench T38 arranged between the outer lead portion 30X and the connection region CDP, and having a trench depth shallower than the trench depth of the lead trench T31.

Incidentally, in the present embodiment, the vertical-channel MOSFET is used as described above, and therefore, the wire 12 is not connected to the lead 30D. The drain lead 30D is coupled to the die pad 20 to be electrically connected to the drain electrode DE of the semiconductor chip 10 via the die bonding material 11 and the die pad 20.

In the present embodiment, the drain lead 30D does not include the wire bonding region 30W (see FIG. 4). Thus, the case of the lead 30D does not include the mode of occurrence of the peeling in the wire bonding region 30W, and therefore, the lead 30D does not include the trench shaped by the pressing process to correspond to the lead trench T31 of FIG. 4 and the lead trench T34 of FIG. 5. On the other hand, the lead trench T37 and the lead trench 38 illustrated in FIG. 6 are trenches for suppressing the peeling, if happening, occurring near the border between the outer lead portion 30X and the inner lead portion 30M and the growth of the peeling to the wire bonding region 30W, and correspond to the lead trench T32 and the lead trench T33 illustrated in FIG. 4, respectively. The lead trench T37 and the lead trench T38 are trenches formed by, for example, irradiating the lead 30D with a laser. The lead trench T37 and the lead trench T38 each has a trench depth shallower than the trench depth of the lead trench T31 of FIG. 4. As illustrated in FIG. 6, the lead trench T37 is arranged closer to the outer lead portion 30X than the connection region CDP. The lead trench T38 is formed closer to the outer lead portion 30X than the connection region CDP.

As illustrated in FIG. 13, the lead trench T32, the lead trench T35, and the lead trench T37 are linearly arranged in the X direction. Similarly, as illustrated in FIG. 14, the lead trench T33, the lead trench T36, and the lead trench T38 are linearly arranged in the X direction.

Note that a horizontal-channel MOSFET may be used as a modification example of the transistor described with reference to FIG. 8. In this case, the gate electrode pad GE, the source electrode pad SE, and the drain electrode (drain electrode pad) DE are arranged on the upper surface 10t of the semiconductor chip 10 of FIG. 3. The drain lead 30D is provided with the wire bonding region 30W (see FIG. 4) similarly to the lead 30S and the lead 30G, and the wire bonding region 30W is covered with the metal film 33 made of, for example, silver (see FIG. 4). In this case, the peeling possibly occurs at the interface between the metal film 33 formed in the wire bonding region 30W and the sealing body 40 (see FIG. 4). Thus, a trench formed by the pressing process is preferably formed on the upper surface 30t of the lead 30D similarly to the lead trench T31 of FIG. 4 and the lead trench T34 of FIG. 5 in order to prevent the growth of the peeling occurring in the wire bonding region 30W to the entire inner lead portion 30M.

Note that the trench depth of the lead trench T31 of FIG. 4 and the trench depth of the lead trench T34 of FIG. 5 are, for example, about 200 μm. The trench depths of the lead trench T32 and the lead trench T33 illustrated in FIG. 4, the lead trench T35 and the lead trench T36 illustrated in FIG. 5, and the lead trench T37 and the lead trench T38 illustrated in FIG. 6 are, for example, about 5 μm to 30 μm.

<Modification Examples of Lead>

Figure 15:
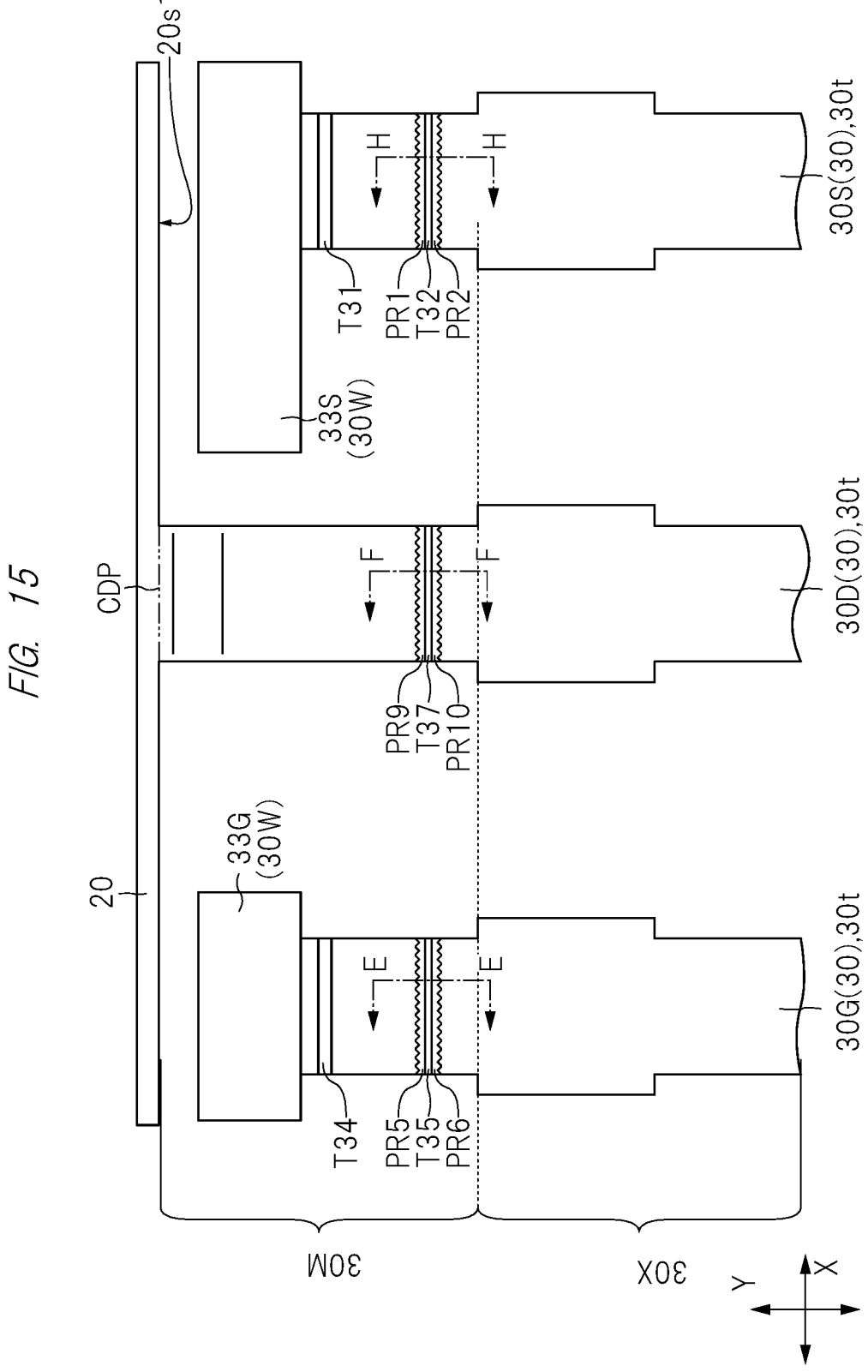
FIG. 15 is an enlarged plan view of a modification example of the leads of FIG. 13.
Figure 16:
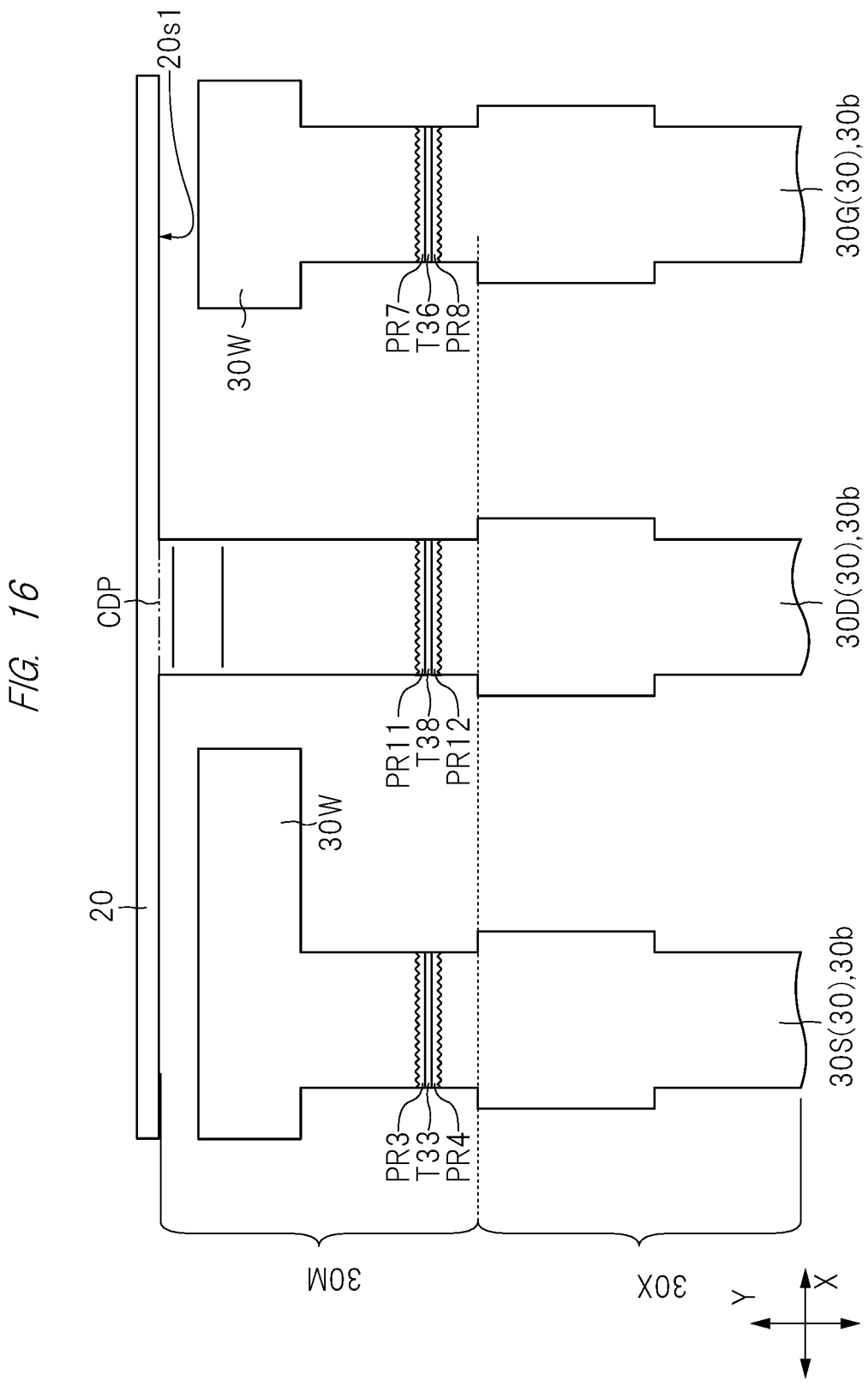
FIG. 16 is an enlarged plan view of a surface opposite the leads of FIG. 15.
Figure 17:
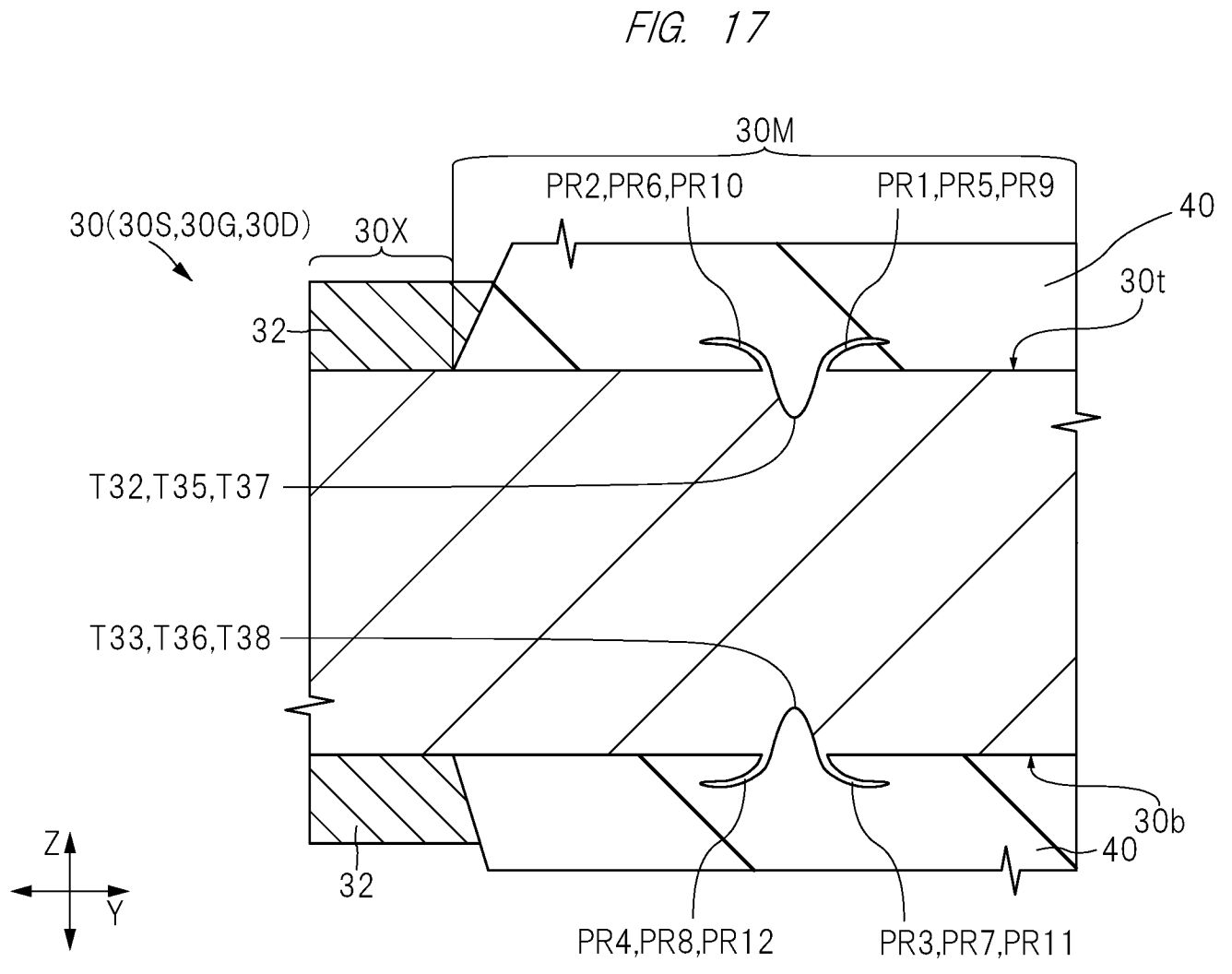

Next, modification examples of the leads illustrated in FIGS. 13 and 14 will be described. FIG. 15 is an enlarged plan view of a modification example of the leads of FIG. 13. FIG. 16 is an enlarged plan view of a surface opposite the leads of FIG. 15. FIG. 17 is an enlarged cross-sectional view taken along line H-H of FIG. 15. Note that an enlarged cross section taken along line E-E of FIG. 15 and an enlarged cross section taken along line F-F of FIG. 15 have the similar structure to that of FIG. 17, and therefore, symbols corresponding to the gate lead 30G and the drain lead 30D are attached in FIG. 17 in addition to the symbols corresponding to the source lead 30S of FIG. 15.

In the modification example of FIGS. 15 to 17, as illustrated in FIGS. 15 and 17, a protrusion portion PR1 and a protrusion portion PR2 extending in an extending direction (that is the X direction in FIG. 15) of the lead trench T32 and covering part of the upper surface 30t as illustrated in FIG. 17 are arranged at both sides of the lead trench T32 arranged in the source lead 30S. Further, as illustrated in FIG. 16, a protrusion portion PR3 and a protrusion portion PR4 extending: in an extending direction (that is the X direction in FIG. 16) of the lead trench T33 and covering part of the lower surface 30b as illustrated in FIG. 17 are arranged at both sides of the lead trench T33. As illustrated in FIG. 17, part of the sealing body 40 is arranged between the protrusion portion PR1 and the upper surface 30t, between the protrusion portion PR2 and the upper surface 30t, between the protrusion portion PR3 and the lower surface 30b, and between the protrusion portion PR4 and the lower surface 30b.

Each of the protrusion portion PR1, the protrusion portion PR2, the protrusion portion PR3, and the protrusion portion PR4 functions as a "wedge" or "anchor" configured to suppress the peeling between the sealing body 40 and the leads 30. Thus, the present modification example is more effective in stopping the growth of peeling between the lead 30S and the sealing body 40 than the examples of FIGS. 4 to 6, 13, and 14.

The protrusion portion PR1, the protrusion portion PR2, the protrusion portion PR3, and the protrusion portion PR4 can be formed by adjusting output of the laser beam, irradiation time (scan speed) of the laser beam, and the number of times of irradiation of the laser beam in forming the lead trench T32 and the lead trench T33 by the laser irradiation. When a metal is irradiated with the laser (laser beam), the part of the metal irradiated with the laser is melted, and is discharged outside the irradiated region. The lead trench T32 and the lead trench T33 are formed by the above method. At this time, by setting the laser output and the irradiation time to have appropriate values, the molten metal discharged around the lead trench T32 and the lead trench T33 is resolidified along the lead trench T32 and the lead trench T33 to form the shapes of the protrusion portion PR1, the protrusion portion PR2, the protrusion portion PR3, and the protrusion portion PR4 illustrated in FIGS. 15 to 17. If the protrusion portion PR1, the protrusion portion PR2, the protrusion portion PR3, and the protrusion portion PR4 are unnecessary, there is also a method for removing them. In the present modification example, attention is paid to the functioning of each of the protrusion portion PR1, the protrusion portion PR2, protrusion portion PR3, and the protrusion portion PR4 as the "wedge" or "anchor", and the protrusion portion PR1, the protrusion portion PR2, protrusion portion PR3, and the protrusion portion PR4 are purposely formed to be utilized without being removed.

In the present modification example, protrusion portions similar to the protrusion portion PR1, the protrusion portion PR2, the protrusion portion PR3, and the protrusion portion PR4, which are formed in the source lead 30S, are arranged also in the gate lead 30G and the drain lead 30D.

A protrusion portion PR5 and a protrusion portion PR6 extending in an extending direction (that is the X direction in FIG. 15) of the lead trench T35 and covering part of the upper surface 30t as illustrated in FIG. 17 are arranged at both sides of the lead trench T35 arranged in the gate lead 30G. Further, as illustrated in FIG. 16, a protrusion portion PR7 and a protrusion portion PR8 extending in an extending direction (that is the X direction in FIG. 16) of the lead trench T36 and covering part of the lower surface 30b as illustrated in FIG. 17 are arranged at both sides of the lead trench T36. As illustrated in FIG. 17, part of the sealing body 40 is arranged between the protrusion portion PR5 and the upper surface 30t, between the protrusion portion PR6 and the upper surface 30t, between the protrusion portion PR7 and the lower surface 30b, and between the protrusion portion PR8 and the lower surface 30b.

A protrusion portion PR9 and a protrusion portion PR10 extending in an extending direction (that is the X direction in FIG. 15) of the lead trench T37 and covering part of the upper surface 30t as illustrated in FIG. 17 are arranged at both sides of the lead trench T37 arranged in the drain lead 30D. Further, as illustrated in FIG. 16, a protrusion portion PR11 and a protrusion portion PR12 extending in an extending direction (that is the X direction in FIG. 16) of the lead trench T38 and covering part of the lower surface 30b as illustrated in FIG. 17 are arranged at both sides of the lead trench T38. As illustrated in FIG. 17, part of the sealing body 40 is arranged between the protrusion portion PR9 and the upper surface 30t, between the protrusion portion PR10 and the upper surface 30t, between the protrusion portion PR11 and the lower surface 30b, and between the protrusion portion PR12 and the lower surface 30b.

For example, when it is confirmed that the peeling tends to frequently occur in the lead 30S, which is arranged at a specific position, of the leads 30, the protrusion portion PR1, the protrusion portion PR2, the protrusion portion PR3, and the protrusion portion PR4 may be selectively formed in the easily peeling lead 30S while no protrusion portion may be formed in the other leads 30. However, a plurality of protrusion portions similar to the protrusion portion PR1, the protrusion portion PR2, the protrusion portion PR3, and the protrusion portion PR4 is preferably formed in each of the three leads 30 in order to securely stop the growth of peeling from the outer lead portions in the leads 30.

Figure 18:
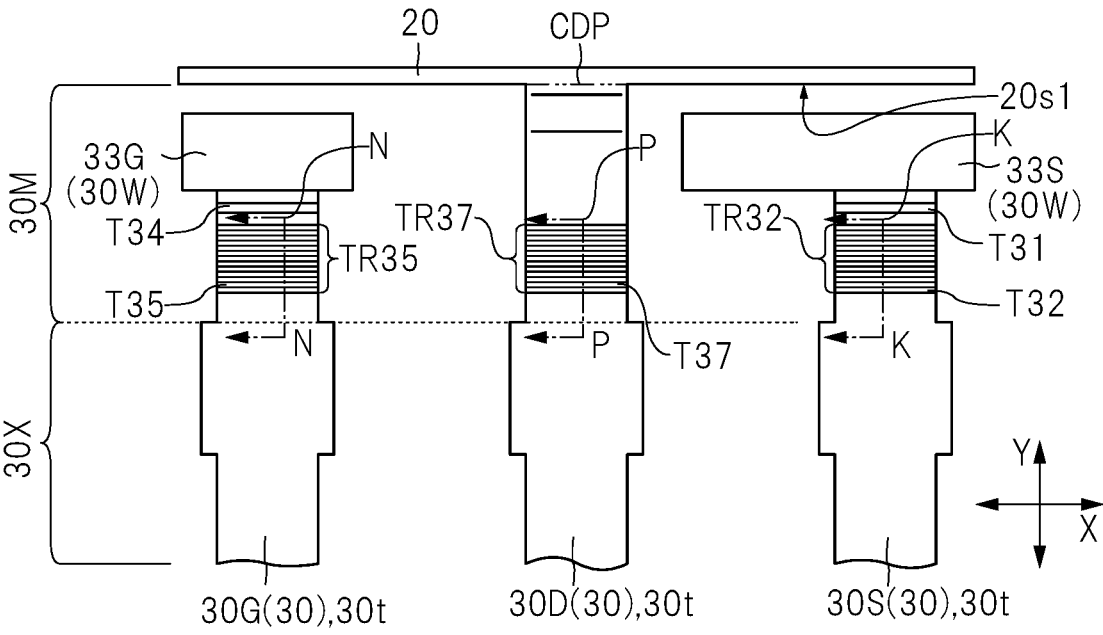
FIG. 18 is an enlarged plan view of another modification example of the leads of FIG. 13.
Figure 19:
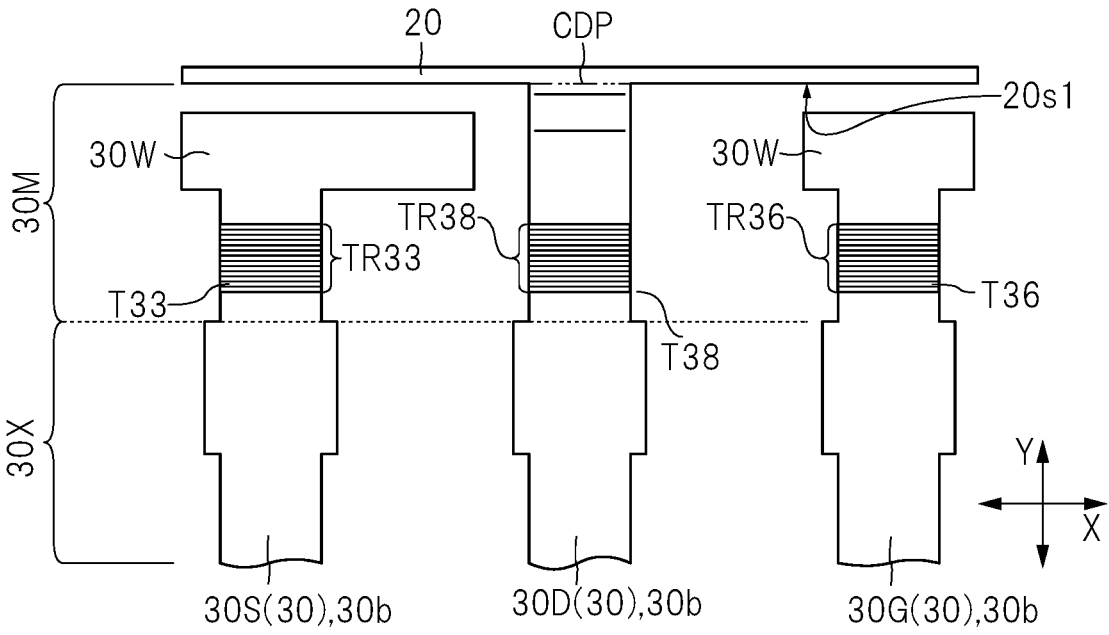
FIG. 19 is an enlarged plan view of a surface opposite the leads of FIG. 18.
Figure 20:
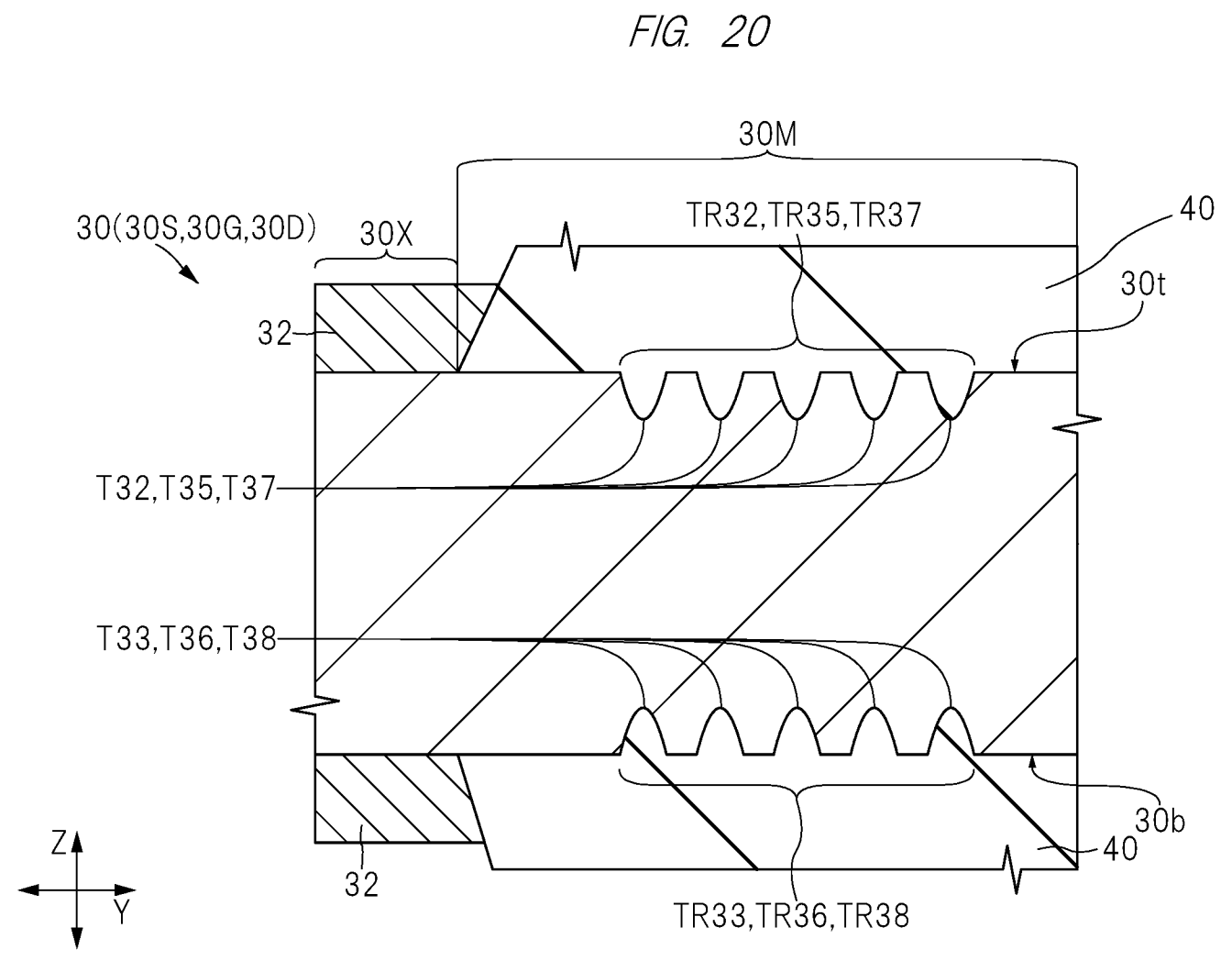

FIG. 18 is an enlarged plan view of another modification example of the leads of FIG. 13. FIG. 19 is an enlarged plan view of a surface opposite the leads of FIG. 18. FIG. 20 is an enlarged cross-sectional view taken along line K-K of FIG. 18. An enlarged cross section taken along line N-N of FIG. 18 and an enlarged cross section taken along line P-P of FIG. 18 have the similar structure to that of FIG. 20, and therefore, symbols corresponding to the gate lead 30G and the drain lead 30D are attached in FIG. 20 in addition to the symbols corresponding to the source lead 30S of FIG. 18.

The modification example of FIGS. 18 to 20 is different from the leads 30 of FIGS. 13 and 14 in that the number of lead trenches for stopping the growth of peeling is not one but plural. A region where the plurality of lead trenches is formed can be defined as follows.

As illustrated in FIG. 20, the upper surface 30_t_ of the lead 30S includes the lead trench T31 arranged between the outer lead portion 30X and the wire bonding region 30W, and extending in the X direction (see FIG. 13). The upper surface 30_t_ further includes a lead trench region TR32 where a plurality of lead trenches T32 arranged between the outer lead portion 30X and the lead trench T31, and having a trench depth shallower than the trench depth of the lead trench T31 is formed. The lower surface 30_b_ of the lead 30S includes a lead trench region TR33 where a plurality of lead trenches T33 arranged between the outer lead portion 30X and a region opposite the lead trench T31, and having a trench depth shallower than the trench depth of the lead trench T31 is arranged.

Since the plurality of lead trenches T32 and the plurality of lead trenches T33 are formed as described in the present modification example, the performance of stopping the growth of peeling can be more improved than those in the examples of FIGS. 4 to 6, 13, and 14.

In the present modification example, for example, the lead trenches T32 are arranged between the lead trench T31 and the outer lead portion 30X as illustrated in FIG. 18. Thus, some of the lead trenches T32 are arranged closer to the outer lead portion 30X than the wire bonding region 30W while others are arranged closer to the wire bonding region 30W than to the outer lead portion 30X.

In the present modification example, similar measures are taken also for the gate lead 30G. That is, the leads 30 include the lead 30G electrically connected to a second electrode pad of the electrode pads via the wire 12G of the wires 12. The upper surface 30_t_ of the lead 30G includes the lead trench T34 arranged between the outer lead portion 30X and the wire bonding region 30W, and extending in the X direction. The upper surface 30_t_ further includes a lead trench region TR35 where a plurality of lead trenches T35 arranged between the outer lead portion 30X and the lead trench T34, and having a trench depth shallower than the trench depth of the lead trench T34 is formed. The lower surface 30_b_ of the lead 30G includes a lead trench region TR36 where a plurality of lead trenches T36 arranged between the outer lead portion 30X and a region opposite the lead trench T34, and having a trench depth shallower than the trench depth of the lead trench T34 is formed.

Similar trenches for the measures against the growth of peeling are preferably formed also in the lead 30D in a viewpoint of taking the measures against the growth of peeling for all the leads 30. The leads 30 include the lead 30D coupled to the side 20_s_1 of the die pad 20 as illustrated in FIG. 18, and the upper surface 30_t_ of the lead 30D includes the connection region CDP connected to the die pad 20 and a lead trench region TR37 where a plurality of lead trenches T37 arranged between the outer lead portion 30X and the connection region CDP, and having a trench depth shallower than the trench depth of the lead trench T31 is formed as illustrated in FIG. 6. The lower surface 30_b_ of the lead 30D includes a lead trench region TR38 where a plurality of lead trenches T38 arranged between the outer lead portion 30X and the connection region CDP, and having a trench depth than the lead trench T31 is formed.

Incidentally, in the example of FIGS. 18 and 19, the lead trenches T32, the lead trenches T33, the lead trenches T35, the lead trenches T36, the lead trenches T37, and the lead trenches T38 extend in the X direction. Note that the lead trenches are variously shaped. For example, a grid-like lead trench may be formed in the lead trench region TR32, the lead trench region TR33, the lead trench region TR35, the lead trench region TR36, the lead trench region TR37, and the lead trench region TR38 similarly to the grid trench T26 described with reference to FIG. 12. Further, for example, the extending directions of the lead trenches are not limited to the X direction and the Y direction, and the lead trench may be made of a plurality of portions extending in, for example, a direction tilted at 90° or less with respect to the X direction or the Y direction.

<Method of Manufacturing Semiconductor Device>

Figure 21:
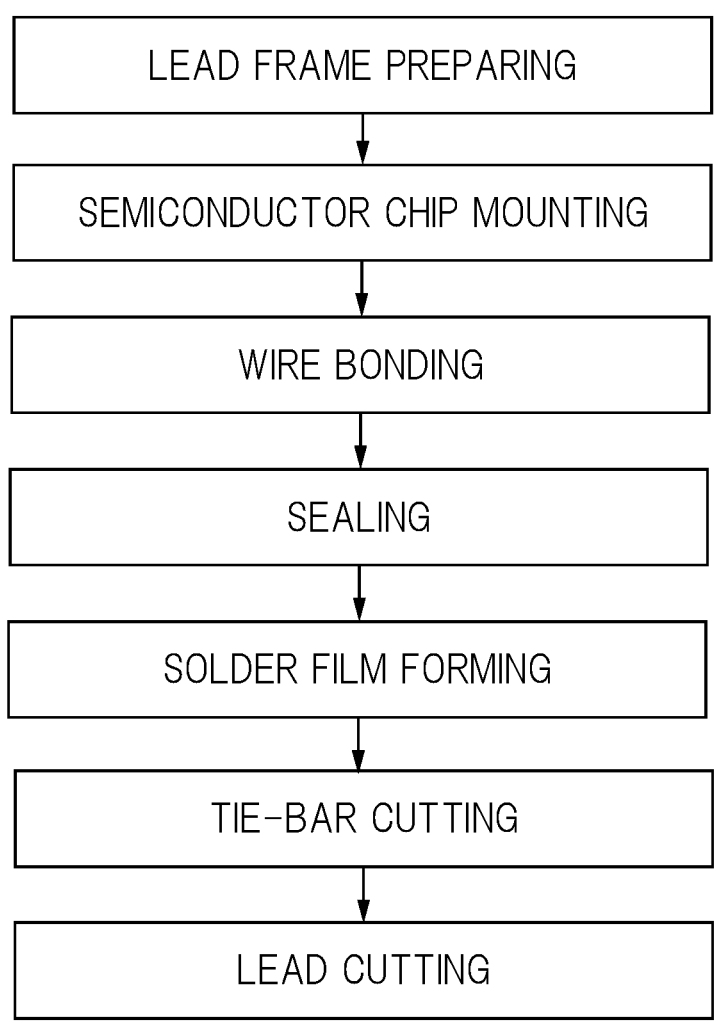
FIG. 21 is a flowchart of exemplary steps of manufacturing the semiconductor device of FIGS. 1 to 6.

Next, a method of manufacturing the semiconductor device illustrated in FIGS. 1 to 6 will be described. FIG. 21 is a flowchart of exemplary steps of manufacturing the semiconductor device illustrated in FIGS. 1 to 6. In the example of FIG. 21, the method of manufacturing the semiconductor device according to the present embodiment includes the lead frame preparing step, the semiconductor chip mounting step, the wire bonding step, the sealing step, the solder film forming step, the tie-bar cutting step, and the lead cutting step.

<Lead Frame Preparing Step>

Figure 22:
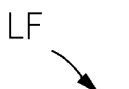
FIG. 22 is an enlarged plan view of part of a lead frame prepared in a lead frame preparing step of FIG. 21.
Figure 22:
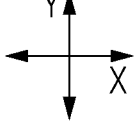

First, in the lead frame preparing step of FIG. 21, a lead frame LF of FIG. 22 is prepared. FIG. 22 is an enlarged plan view of part of the lead frame prepared in the lead frame preparing step of FIG. 21. Note that detailed structures of the die pad 20, the leads 30, and the like arranged in a device forming portion LFd of FIG. 22 will be described with reference to FIGS. 3 to 6 and FIGS. 9 to 20 as needed.

As illustrated in FIG. 22, the lead frame LF prepared in this step includes a plurality of the device forming portions LFd connected to a frame portion LFf. FIG. 2 shows eight device forming portions LFd. Each of the device forming portions LFd corresponds to one semiconductor device PKG1 of FIG. 1. The lead frame LF is so-called multi-peace taking base member in which the plurality of device forming portions LFd is arranged in a matrix form. A plurality of semiconductor devices PKG1 (see FIG. 1) can be collectively manufactured by use of the lead frame LF including the device forming portions LFd as described above, and therefore, a manufacture efficiency can be improved. Note that FIG. 22 shows that two rows of device forming portions LFd are arranged in parallel in the X direction. However, the number of rows of the device forming portions LFd may be variously changed. The number of rows may be, for example, one, or three or more.

The lead frame LF is made of a metal material mainly containing, for example, copper (Cu). Each of the device forming portions LFd is connected to the frame portion LFf.

The frame portion LFf is a support portion configured to support each member formed in the device forming portions LFd until the lead separating step of FIG. 21.

The die pad 20 and the leads 30 illustrated in FIG. 3 are formed in the device forming portion LFd. The die pad 20 is coupled to the frame portion LFf via one of the leads 30, and is supported by the frame portion LFf. Each of the leads 30 is coupled to the frame portion LFf, and is supported by the frame portion LFf.

The leads 30 are mutually coupled via a tie-bar LFt1. In the example of FIG. 22, the die pads 20 are mutually coupled via a tie-bar LFt2. As illustrated in FIG. 22, the tie-bar LFt2 is opposite the leads 30 via the die pad 20 in the device forming portion LFd, and includes the side 20s2 opposite the side 20s1 facing the leads 30.

The trench T21 illustrated in FIGS. 9, 10, 11, and 12 is formed in the die pad 20. The trench T21 is shaped by the pressing process using the mold in the lead frame forming step. The trench T22 and the trench T23 illustrated in FIGS. 9, 10, and 11 are formed in the die pad 20. The trench T24 and the trench T25 illustrated in FIGS. 9 and 10 are formed in the die pad 20. The trench T22, the trench T23, the trench T24, and the trench T25 are formed by irradiating the upper surface 20t of the die pad 20 with the laser as described above.

The lead, corresponding to the source lead 30S and the gate lead 30G illustrated in FIG. 13, of the leads 30 includes the wire bonding region 30W. In the lead frame preparing step, the metal film 33 covering the upper surface 30t is formed in the wire bonding region 30W. The metal film 33 is made of silver, and can be formed by, for example, a plating method. In the lead frame preparing step, the lead trench T31 and the lead trench T34 are formed in the lead corresponding to the source lead 30S and the gate lead 30G illustrated in FIG. 13. The lead trench T31 and the lead trench T34 are formed by the pressing process using the mold.

In the lead frame preparing step, the lead trench T32 is formed on the upper surface 30t of the source lead 30S of FIG. 13, of the leads 30, and the lead trench T33 is formed on the lower surface 30b of FIG. 14. Similarly, the lead trench T35 is formed on the upper surface 30t of the gate lead 30G of FIG. 13, and the lead trench T36 is formed on the lower surface 30b of FIG. 14. Similarly, the lead trench T37 is formed on the upper surface 30t of the drain lead 30D of FIG. 13, and the lead trench T38 is formed on the lower surface 30b of FIG. 14. The lead trench T32, the lead trench T33, the lead trench T35, the lead trench T36, the lead trench T37, and the lead trench T38 are formed by irradiating the upper surface 30t or the lower surface 30b of the lead 30 with the laser.

As described above with reference to FIGS. 15 to 17, in the modification example, the protrusion portions functioning as the "wedge" or "anchor" may be formed by adjusting the laser output and the irradiation time. As described above with reference to FIGS. 18 to 20, the lead trenches T32, the lead trenches T33, the lead trenches T35, the lead trenches T36, the lead trenches T37, and the lead trenches T38 may be formed in the lead trench region TR32, the lead trench region TR33, the lead trench region TR35, the lead trench region TR36, the lead trench region TR37, and the lead trench region TR38, respectively.

<Semiconductor Chip Mounting Step>

Next, in the semiconductor chip mounting step of FIG. 21, the semiconductor chip 10 is mounted on the die pad 20 as illustrated in FIG. 3.

In this step, the semiconductor chip 10 is mounted via the die bonding material 11 on the region R1 (see FIG. 9) of the upper surface 20t of the die pad 20 unified with the lead 30D that is the drain terminal. The semiconductor chip 10 is adhered and fixed via the die bonding material 11 such that the lower surface 10b on which the drain electrode DE (see FIG. 4) is formed faces the upper surface 20t that is the chip mounting surface of the die pad 20. Therefore, the drain electrode DE of the semiconductor chip 10 is electrically connected to the die pad 20 via the die bonding material 11 that is the conductive connecting material.

In this step, the die bonding material 11 is applied on the upper surface 20t of the die pad 20, and then, the semiconductor chip 10 is arranged on the die bonding material 11. Then, the semiconductor chip 10 and the die pad 20 are fixed by hardening the die bonding material 11.

As the die bonding material 11, for example, a solder material can be used. Alternatively, the die bonding material 11 may be a conductive resin adhesion material called silver (Ag) paste which contains a plurality of silver (Ag) particles (Ag filler). When the die bonding material 11 is the solder material, a reflow processing is performed as a method of hardening the die bonding material. When the die bonding material 11 is the conductive resin adhesion material, a thermosetting resin component contained in the die bonding material 11 is hardened by being heated.

<Wire Bonding Step>

Figure 23:
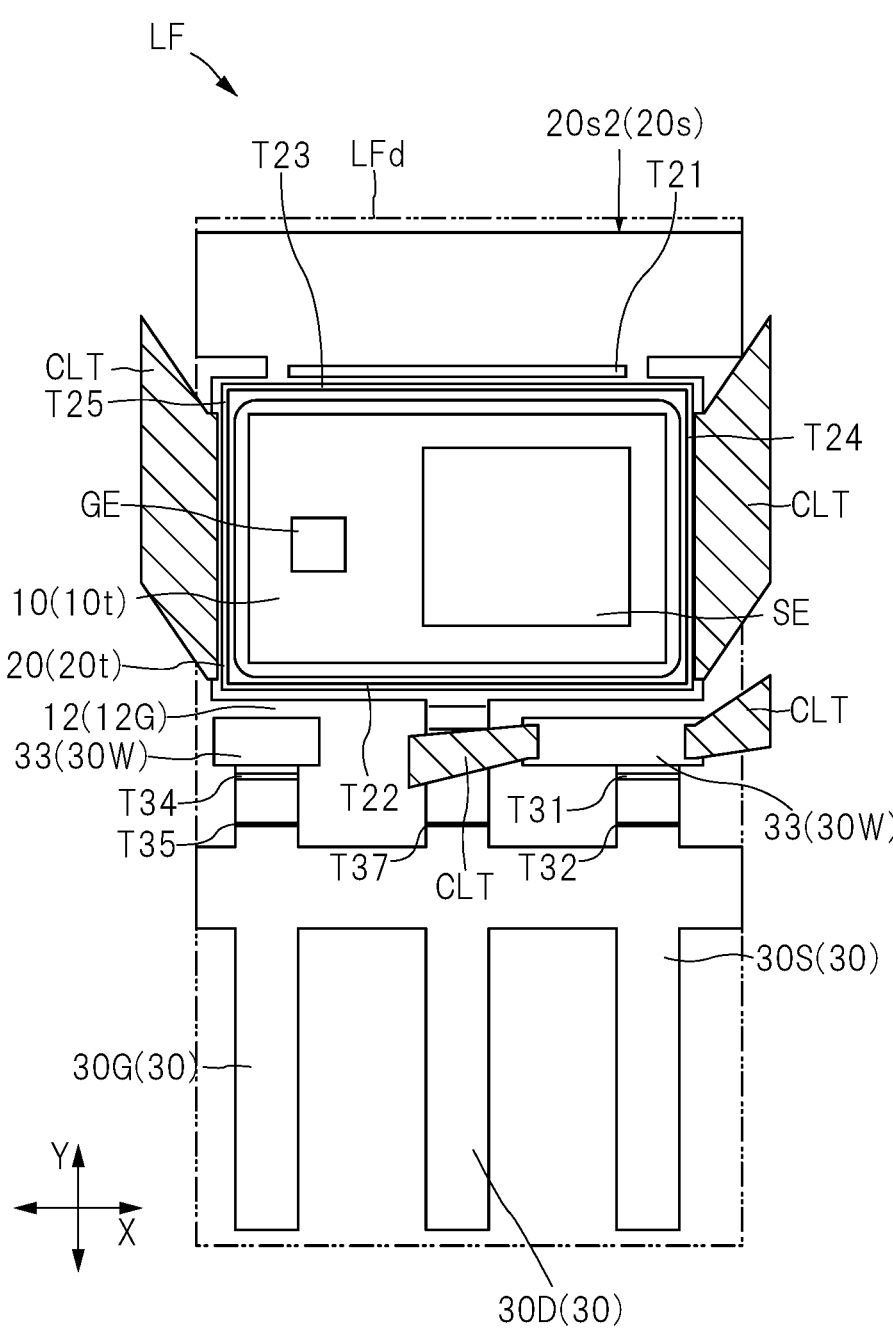
FIG. 23 is an enlarged plan view of an exemplary layout of a jig configured to press and fix the die pad in the lead frame in a wire bonding step of FIG. 21.

Next, in the wire bonding step of FIG. 21, the electrode pads (the gate electrode pad GE and the source electrode pad SE) of the semiconductor chip 10 are electrically connected to the leads 30 via the wires (metal wires) 12, respectively, as illustrated in FIG. 3. FIG. 23 is an enlarged plan view of an exemplary layout of a jig configured to press and fix the die pad in the lead frame in the wire bonding step of FIG. 21.

In this step, the gate electrode pad GE of the semiconductor chip 10 is electrically connected to the lead 30G via the wire 12G. Further, in this step, the source electrode pad SE of the semiconductor chip 10 is electrically connected to the lead 30S via the wire 12S.

Various modification examples are applicable to the method for connecting the wire 12. As the method, a wedge bonding system using a bonding tool called wedge tool, a ball bonding system using a bonding tool called capillary for bonding a ball portion to a bonding-target member (electrode pad or lead) and others are exemplified.

In the present embodiment, the metal film 33 made of silver is formed in the wire bonding region 30W. One end of the wire 12 is bonded to the gate electrode pad GE or the source electrode pad SE while the other end of the wire 12 is bonded to the metal film 33 formed in the wire bonding region 30W.

In this step, as illustrated in FIG. 23, when the wire 12 is bonded, part of the die pad 20 and part of the wire bonding region 30W are pressed by a clamp tool CLT to fix the lead frame LF. At this time, when the trench T23 and the trench T24 are arranged at a portion where the clamp tool CLT contacts the die pad 20, an expected strength based on the clamp tool CLT may be insufficient. The die pad 20B according to the modification example described with reference to FIG. 11 is preferable in that the fixing strength of the lead frame LF based on the clamp tool CLT can be improved in the wire bonding step since the trench T24 and the trench T25 illustrated in FIG. 23 are not formed.

<Sealing Step>

Next, in the sealing step of FIG. 21, the semiconductor chip 10, part of the die pad 20, part of each of the leads 30

(the inner lead portion 30M of FIGS. 4 to 6), and the wires 12, which are illustrated in FIG. 3, are sealed with insulative resin to form the sealing body 40 of FIGS. 4 to 6.

In this step, the sealing body 40 is formed by, for example, so-called transfer molding system using a shaping mold including an upper mold (first mold) and a lower mold (second mold) not illustrated. The lead frame LF is arranged such that the die pad 20 and the inner lead portions 30M (see FIG. 13) of the leads 30 in the device forming portion LFd of FIG. 22 are positioned within a cavity of the shaping mold. Then, the lead frame LF is sandwiched by the upper mold and the lower mold. When a softened (plasticized) thermosetting resin (insulative resin) is pressed into the cavity of the shaping mold in this state, the insulative resin is shaped to follow a shape of the cavity.

At this time, part of the upper surface 20t of the die pad 20 continued from the side 20s2 and the lower surface 20b of the die pad 20 tightly contact the shaping mold. Thus, as illustrated in FIGS. 4 to 6, after this step, the part of the upper surface 20t of the die pad 20 and the lower surface 20b are exposed from the sealing body 40.

The sealing body 40 is shaped, and then, is heated until part of the thermosetting resin contained in the sealing body 40 is hardened (this step is called temporary hardening). At the time when the lead frame LF can be taken out from the shaping mold by the temporary hardening, the lead frame LF is taken out from the shaping mold. Then, these members are conveyed to a furnace, and is further heated (cure-baked). Therefore, the rest of the thermosetting resin is hardened to provide the sealing body 40.

The sealing body 40 is mainly made of the insulative resin, and the function (such as resistance to warp deformation) of the sealing body 40 is improved by mixing filler particles such as silica (silicon dioxide; $SiO_2$) particles with the thermosetting resin.

<Solder Film Forming Step>

Figure 24:
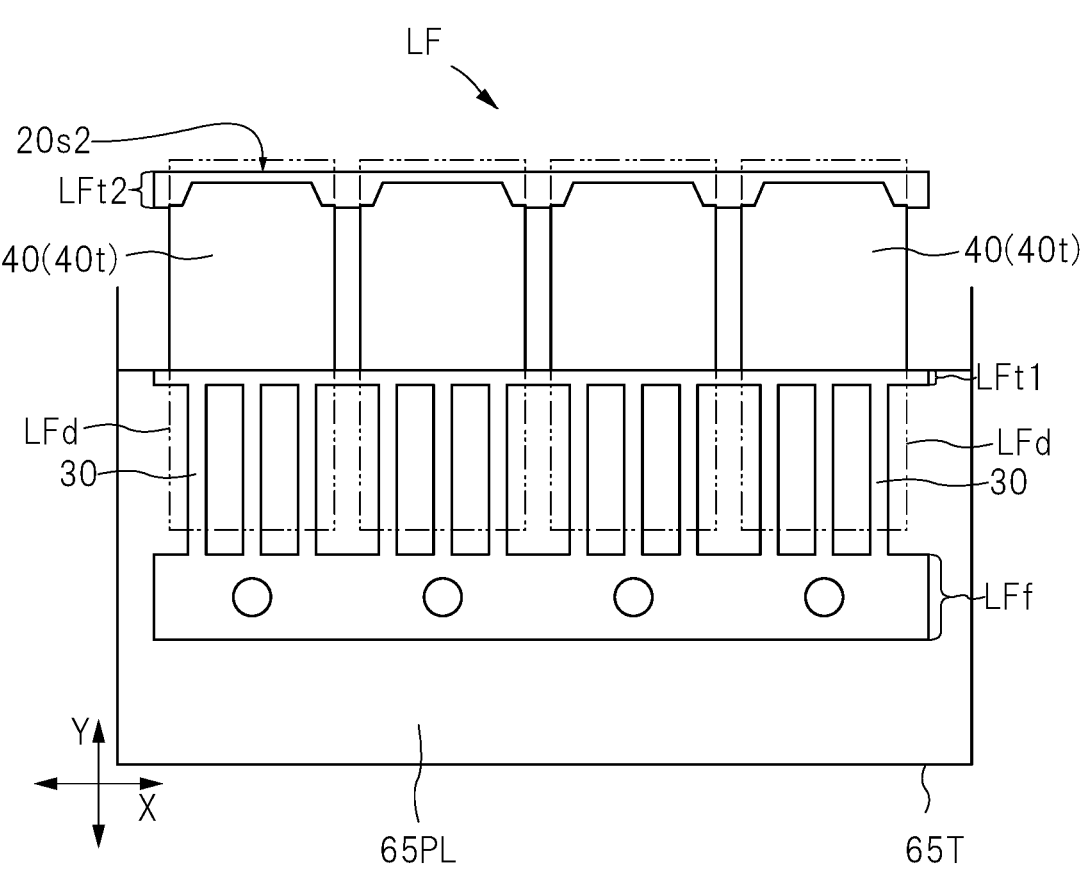
FIG. 24 is an explanatory diagram of an outline of a solder-film forming step in a dipping method.

Next, in the solder film forming step of FIG. 21, the lead frame LF is dipped in a plating solution not illustrated to form metal films (the metal film 22 and the metal film 32 illustrated in FIGS. 6 to 8) on the surface of the metal portions (outer portions) exposed from the sealing body 40. FIG. 24 is an explanatory diagram of an outline of the solder film forming step using a dipping method. Note that the metal film 22 is formed on the lower surface 20b of the die pad 20 and the like of FIG. 4 before this step. As a method for forming the metal film 22, for example, a plating method is exemplified.

In this step, by the solder dipping method, the metal film 32 made of solder (see FIGS. 4 to 6) is formed on the portions (outer lead portions) of the leads 30 exposed from the resin.

As illustrated in FIG. 24, by the solder dipping method, the lead frame LF is arranged in a solder solution bath 65T storing a molten solder solution 65PL therein. At this time, part of each of the leads 30 in the lead frame LF is selectively dipped in the molten solder solution 65PL while most of the sealing body 40 is not dipped in the molten solder solution 65PL. Therefore, the metal film 32 made of solder (see FIGS. 4 to 6) can be formed in each of the leads 30.

In this step, a temperature of the molten solder solution 65PL is as high as, for example, about 300° C. As described above, the solder film forming step is considerable as a cause of the peeling occurring in the border between the outer lead portion 30X and the inner lead portion 30M of the lead 30. It is considered, since the sealing body 40 and the leads 30 are exposed to the high-temperature atmosphere, stress is caused on the interfaces of the close contacts between the sealing body 40 and the leads 30 to cause the peeling.

<Tie-Bar Cutting Step>

Next, in the tie-bar cutting step of FIG. 21, the tie-bar LFt1 of FIG. 22 is cut. In the tie-bar cutting step, the tie-bar LFt2 is cut to divide the die pads 20 coupled via the tie-bar LFt2. After this step, the leads 30 are coupled via the frame portion LFf. The die pads 20 are coupled via the drain leads 30D (see FIG. 3) functioning as a suspending lead and the frame portion LFf.

As a method for cutting the tie-bar LFt1 and the tie-bar LFt2, a pressing process (cutting process) using a punch and a die not illustrated can be used. This step is performed after the solder film forming step, and therefore, side surfaces that have been newly formed in this cutting step are not covered with the metal film 32.

<Lead Cutting Step>

Next, in the lead cutting step, the leads 30 and the frame portion LFf are separated from each other to separate the leads 30. In this step, end portions of the leads 30 are cut by the pressing process (cutting process) using the punch and the die not illustrated. End surfaces that have been newly formed by this lead cutting step are not covered with the metal film 32. By this step, the device forming portions LFd of FIG. 22 are cut and separated into pieces to provide the semiconductor devices of FIG. 1.

Note that the example of FIG. 21 shows that the solder film forming step, the tie-bar cutting step and the lead cutting step are performed in this order. The order of the solder film forming step, the tie-bar cutting step and the lead cutting step may be variously modified. For example, the solder film forming step may be performed after the tie-bar cutting step. In this modification example, a solder film is formed on side surfaces of a cut tie-bar. In the above modification example, when the tie-bar cutting step is performed before the solder film forming step in order to improve the rigidity of the lead frame in the solder film forming step, only the tie-bar LFt1 may be cut first, and then, the tie-bar LFt2 may be cut after the solder film forming step.

The semiconductor device PKG1 of FIGS. 1 to 6 is provided by the above steps. Then, tests or checks such as electric test or appearance check are performed as needed, and then, the semiconductor devices determined as being good are conveyed to a next step such as wrapping step.

In the foregoing, the invention made by the inventors of the present application has been concretely described on the basis of the embodiments. However, it is needless to say that the present invention is not limited to the foregoing embodiments, and various modifications can be made within the scope of the present invention.

What is claimed is:

1. A semiconductor device comprising:
a die pad having a first surface;
a semiconductor chip mounted on a first region of the first surface of the die pad via a die bonding material;
a plurality of leads arranged along a first chip side, which is extending in a first direction, of a plurality of sides of the semiconductor chip;
a plurality of wires electrically connecting a plurality of electrode pads arranged on a first chip surface of the semiconductor chip with the plurality of leads, respectively; and
a sealing body sealing the semiconductor chip and the plurality of wires so as to contact with the first surface of the die pad, wherein the die pad includes:
 a first portion having a first side facing the plurality of leads in plan view, and including the first region;
 a second portion having a second side opposite the first side in plan view; and
 a third portion connecting the first portion and the second portion with each other,
wherein a width of the third portion that is a length of the third portion in the first direction is smaller than a width of the first portion that is a length of the first portion in the first direction,
wherein the first surface of the die pad includes:
 the first region overlapping the semiconductor chip;
 a second region arranged between the first side and the first region; and
 a third region arranged between the first region and the third portion,
wherein the first surface of the die pad includes:
 a first trench arranged in the third portion, and extending in the first direction;
 a second trench arranged in the second region of the first portion, and extending in the first direction; and
 a third trench arranged in the third region of the first portion, and extending in the first direction,
wherein the first trench has:
 a first trench length that is a length of the first trench in the first direction; and
 a first trench width that is a length of the first trench in a second direction crossing the first direction,
wherein the second trench has:
 a second trench length that is a length of the second trench in the first direction; and
 a second trench width that is a length of the second trench in the second direction,
wherein the third trench has:
 a third trench length that is a length of the third trench in the first direction; and
 a third trench width that is a length of the third trench in the second direction,
wherein each of the second trench length and the third trench length is larger than the first trench length, and
wherein each of the second trench width and the third trench width is smaller than the first trench width.

2. The semiconductor device according to claim 1,
wherein each of a second trench depth of the second trench and a third trench depth of the third trench is smaller than a first trench depth of the first trench.

3. The semiconductor device according to claim 2,
wherein the first trench depth of the first trench is larger than each trench depth of a plurality of trenches including the second trench and the third trench arranged on the first surface of the first portion of the die pad, and
wherein the first trench width of the first trench is larger than each trench width of the plurality of trenches including the second trench and the third trench arranged on the first surface of the first portion of the die pad.

4. The semiconductor device according to claim 1,
wherein the first portion of the die pad further includes:
 a third side crossing the first side; and
 a fourth side opposite the third side and crossing the first side,
wherein the first surface of the die pad further includes:
 a fourth region arranged between the third side and the first region; and
 a fifth region arranged between the fourth side and the first region, wherein the first surface of the die pad further includes:
 a fourth trench arranged in the fourth region of the first portion, and extending in the second direction; and
 a fifth trench arranged in the fifth region of the first portion, and extending in the second direction,
wherein the fourth trench has a fourth trench length that is a length of the fourth trench in the second direction and a fourth trench width that is a length of the fourth trench in the first direction,
wherein the fifth trench has a fifth trench length that is a length of the fifth trench in the second direction and a fifth trench width that is a length of the fifth trench in the first direction, and
wherein each of the fourth trench width and the fifth trench width is smaller than the first trench width.

5. The semiconductor device according to claim 4,
wherein the first portion of the die pad has a quadrangular shape in plan view, and
wherein any of the second trench, the third trench, the fourth trench, and the fifth trench is arranged in a shortest path from each of four corners of the quadrangular shape of the first portion to the first region.

6. The semiconductor device according to claim 5,
wherein the second trench, the third trench, the fourth trench, and the fifth trench are arranged to surround the first region and are mutually coupled.

7. The semiconductor device according to claim 1,
wherein the first region of the first portion is flatter than each of the second region and the third region, and
wherein each of the second trench and the third trench terminates before reaching a periphery of the first portion in plan view.

8. The semiconductor device according to claim 1,
wherein each of the plurality of leads includes:
 a first lead surface;
 a second lead surface opposite the first lead surface;
 an inner lead portion sealed with the sealing body, and
 an outer lead portion exposed from the sealing body,
wherein the plurality of leads includes a first lead electrically connected to a first electrode pad of the plurality of electrode pads via a first wire of the plurality of wires,
wherein the first lead surface of the first lead includes:
 a first wire bonding region covered with a first metal film to which the first wire is bonded;
 a first lead trench arranged between the outer lead portion and the first wire bonding region, and extending in the first direction; and
 a second lead trench arranged between the outer lead portion and the first lead trench, and having a second trench depth shallower than a first trench depth of the first lead trench, and
wherein the second lead surface of the first lead includes
 a third lead trench arranged between the outer lead portion and a region opposite the first lead trench, and having a third trench depth shallower than the first trench depth of the first lead trench.

9. The semiconductor device according to claim 8,
wherein the plurality of leads includes a second lead electrically connected to a second electrode pad of the plurality of electrode pads via a second wire of the plurality of wires,
wherein the first lead surface of the second lead includes:
 a second wire bonding region covered with a second metal film to which the second wire is bonded;

a fourth lead trench arranged between the outer lead portion and the second wire bonding region, and extending in the first direction; and a fifth lead trench arranged between the outer lead portion and the fourth lead trench, and having a fifth trench depth shallower than a fourth trench depth of the fourth lead trench, and wherein the second lead surface of the second lead includes a sixth lead trench arranged between the outer lead portion and a region opposite the fourth lead trench, and having a sixth trench depth shallower than the fourth trench depth of the fourth lead trench.

10. The semiconductor device according to claim 9, wherein the plurality of leads includes a third lead coupled to the first side of the die pad, wherein the first lead surface of the third lead includes:

a connection region connected to the die pad; and a seventh lead trench arranged between the outer lead portion and the connection region, and having a seventh trench depth shallower than a first trench depth of the first lead trench, and wherein the second lead surface of the third lead includes an eighth lead trench arranged between the outer lead portion and the connection region, and having an eighth trench depth shallower than the first trench depth of the first lead trench.

11. The semiconductor device according to claim 8, wherein the first lead trench is arranged closer to the first wire bonding region than the outer lead portion, and wherein the second lead trench is arranged closer to the outer lead portion than the first wire bonding region.

12. The semiconductor device according to claim 8, wherein the outer lead portion of each of the plurality of leads is covered with a solder film.

13. The semiconductor device according to claim 8, wherein a first protrusion portion and a second protrusion portion extending in an extending direction of the second lead trench and covering part of the first lead surface are arranged on both sides of the second lead trench, wherein a third protrusion portion and a fourth protrusion portion extending in an extending direction of the third lead trench and covering part of the second lead surface are arranged on both sides of the third lead trench, and wherein part of the sealing body is arranged between the first protrusion portion and the first lead surface, between the second protrusion portion and the first lead surface, between the third protrusion portion and the second lead surface, and between the fourth protrusion portion and the second lead surface.

14. A semiconductor device comprising:

a die pad having a first surface;

a semiconductor chip mounted on the first surface of the die pad via a die bonding material;

a plurality of leads arranged in a first direction;

a plurality of wires electrically connecting a plurality of electrode pads arranged on a first chip surface of the semiconductor chip and the plurality of leads, respectively; and a sealing body sealing the semiconductor chip and the plurality of wires, wherein each of the plurality of leads includes:

a first lead surface;

a second lead surface opposite the first lead surface;

an inner lead portion sealed with the sealing body; and an outer lead portion exposed from the sealing body, wherein the plurality of leads includes a first lead electrically connected with a first electrode pad of the plurality of electrode pads via a first wire of the plurality of wires, wherein the first lead surface of the first lead includes:

a first wire bonding region covered with a first metal film to which the first wire is bonded;

a first lead trench arranged between the outer lead portion and the first wire bonding region, and extending in the first direction; and a second lead trench arranged between the outer lead portion and the first lead trench, and having a second trench depth shallower than a first trench depth of the first lead trench, and wherein the second lead surface of the first lead includes a third lead trench arranged between the outer lead portion and a region opposite the first lead trench, and having a third trench depth shallower than the first trench depth of the first lead trench.

15. The semiconductor device according to claim 14, wherein the plurality of leads includes a second lead electrically connected to a second electrode pad of the plurality of electrode pads via a second wire of the plurality of wires, wherein the first lead surface of the second lead includes:

a second wire bonding region covered with a second metal film to which the second wire is bonded;

a fourth lead trench arranged between the outer lead portion and the second wire bonding region, and extending in the first direction; and a fifth lead trench arranged between the outer lead portion and the fourth lead trench, and having a fifth trench depth shallower than a fourth trench depth the fourth lead trench, and wherein the second lead surface of the second lead includes a sixth lead trench arranged between the outer lead portion and a region opposite the fourth lead trench, and having a six trench depth shallower than the fourth trench depth of the fourth lead trench.

16. The semiconductor device according to claim 15, wherein the die pad has a first side facing the plurality of leads in plan view, wherein the plurality of leads includes a third lead coupled to the first side of the die pad, wherein the first lead surface of the third lead includes:

a connection region connected to the die pad; and a seventh lead trench arranged between the outer lead portion and the connection region, and having a seventh trench depth shallower than a first trench depth of the first lead trench, and wherein the second lead surface of the third lead includes an eighth lead trench arranged between the outer lead portion and the connection region, and having an eighth trench depth shallower than the first trench depth the first lead trench.

17. The semiconductor device according to claim 14, wherein the first lead trench is arranged closer to the first wire bonding region than the outer lead portion, and wherein the second lead trench is arranged closer to the outer lead portion than the first wire bonding region.

18. The semiconductor device according to claim 14, wherein the outer lead portion of each of the plurality of leads is covered with a solder film.

19. The semiconductor device according to claim 14, wherein a first protrusion portion and a second protrusion portion extending in an extending direction of the second lead trench and covering part of the first lead surface are arranged on both sides of the second lead trench, wherein a third protrusion portion and a fourth protrusion portion extending in an extending direction of the third lead trench and covering part of the second lead surface are arranged on both sides of the third lead trench, and wherein part of the sealing body is arranged between the first protrusion portion and the first lead surface, between the second protrusion portion and the first lead surface, between the third protrusion portion and the second lead surface, and between the fourth protrusion portion and the second lead surface.

* * * * *